(12) United States Patent
Uozumi et al.

(10) Patent No.: US 7,269,402 B2
(45) Date of Patent: *Sep. 11, 2007

(54) PLL CIRCUIT HAVING A MULTI-BAND OSCILLATOR AND COMPENSATING OSCILLATION FREQUENCY

(75) Inventors: Toshiya Uozumi, Takasaki (JP); Satoshi Tanaka, Tamamura (JP); Masumi Kasahara, Takasaki (JP); Hirotaka Oosawa, Isesaki (JP); Yasuyuki Kimura, Maebashi (JP); Robert Astle Henshaw, Sudbury (GB)

(73) Assignees: Renesas Technology Corp., Tokyo (JP); TTP Com Limited, Melbourne (GB)

( * ) Notice: Subject to any disclaimer, the term of this patent is extended or adjusted under 35 U.S.C. 154(b) by 0 days.

This patent is subject to a terminal disclaimer.

(21) Appl. No.: 11/491,972

(22) Filed: Jul. 25, 2006

(65) Prior Publication Data

US 2006/0258312 A1 Nov. 16, 2006

Related U.S. Application Data

(63) Continuation of application No. 10/373,020, filed on Feb. 26, 2003, now Pat. No. 7,103,337.

(30) Foreign Application Priority Data

May 31, 2002 (GB) .................................. 0212735.5

(51) Int. Cl.
H04B 1/06 (2006.01)

(52) U.S. Cl. .................... 455/255; 455/258; 455/252.1; 331/44; 331/176

(58) Field of Classification Search ............. 455/252.1, 455/255, 258, 260, 262, 264, 333, 334, 425, 455/550.1, 575.1, 561, 412.1, 418, 67.11, 455/63.1, 456.5, 456.6, 208, 67.14, 147, 455/180.3, 183.1, 182.1, 186.1, 185.1, 226.1, 455/316–318, 161.1; 331/17, 25, 44, 176, 331/107 R, 66, 68, 177 R, 16, 175; 327/138, 327/156, 157, 127
See application file for complete search history.

(56) References Cited

U.S. PATENT DOCUMENTS 4,746,879 A * 5/1988 Ma et al. ...................... 331/44

(Continued)

FOREIGN PATENT DOCUMENTS

EP 1047196 10/2000

(Continued)

Primary Examiner—Edward F. Urban
Assistant Examiner—Charles Chow
(74) Attorney, Agent, or Firm—Mattingly, Stanger, Malur & Brundidge, P.C.

(57) ABSTRACT

A semiconductor integrated circuit device for communication is provided with a PLL circuit or the like formed therein, the PLL circuit which is capable of realizing the compensation of fluctuation due to temperature change, the inhibition of increase in the chip area and the ensurement of the performance margin, and which controls a VCO having multiple oscillation frequency bands. In the case where automatic calibration is performed by switching a switch to a side of a DC voltage source in the PLL circuit using a VCO having multiple oscillation bands, a tuning voltage (Vtune) of an RFVCO is fixed to a voltage value of a DC voltage source. However, since a temperature characteristic of canceling a VCO oscillation frequency is given to the DC voltage source, it is possible to minimize the influence on the band selection when a calibration table comes to no optimum one.

2 Claims, 27 Drawing Sheets

U.S. PATENT DOCUMENTS

| | | | |
|---|---|---|---|
| 4,847,569 A | | 7/1989 | Dudziak et al. |
| 4,906,944 A | * | 3/1990 | Frerking .................... 331/1 A |
| 4,921,467 A | * | 5/1990 | Lax ............................ 455/264 |
| 5,036,295 A | * | 7/1991 | Kamitani ..................... 331/10 |
| 5,182,528 A | * | 1/1993 | Zuta ........................... 331/1 A |
| 5,625,325 A | * | 4/1997 | Rotzoll et al. ................ 331/16 |
| 5,839,059 A | * | 11/1998 | Hakkinen et al. ........ 455/115.1 |
| 5,912,595 A | * | 6/1999 | Ma et al. ................ 331/117 D |
| 6,366,177 B1 | | 4/2002 | McCune et al. |
| 6,377,784 B2 | | 4/2002 | McCune |
| 6,744,324 B1 | * | 6/2004 | Adams et al. ................. 331/17 |
| 6,836,192 B1 | * | 12/2004 | Yang et al. ................. 331/179 |
| 6,850,125 B2 | | 2/2005 | Norman et al. |
| 2001/0014593 A1 | | 8/2001 | McCune |
| 2001/0017572 A1 | | 8/2001 | Harpham |
| 2002/0036545 A1 | * | 3/2002 | Fridi et al. ..................... 331/17 |
| 2002/0075080 A1 | * | 6/2002 | Nelson et al. ................. 331/11 |
| 2003/0171105 A1 | * | 9/2003 | Dunworth et al. .......... 455/258 |
| 2004/0102176 A1 | * | 5/2004 | Hayashi et al. .............. 455/333 |

FOREIGN PATENT DOCUMENTS

| | | |
|---|---|---|
| EP | 1 115 206 | 7/2001 |
| EP | 1 189 351 | 3/2002 |
| GB | 2361119 | 10/2001 |
| GB | 2361122 | 10/2001 |
| GB | 2-370435 | 6/2002 |
| JP | 2002-111492 | 4/2002 |

* cited by examiner

Calculate error and add the error to all table

Rewrite table of subject band (Repeated in all bands)

FIG.9
TDMA frame number
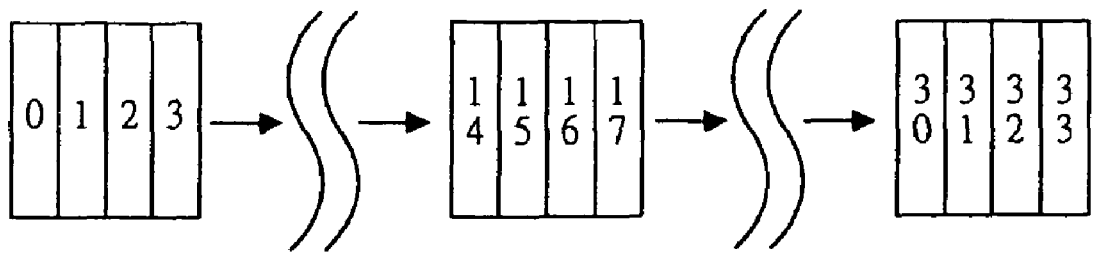
VCO recalibration band number
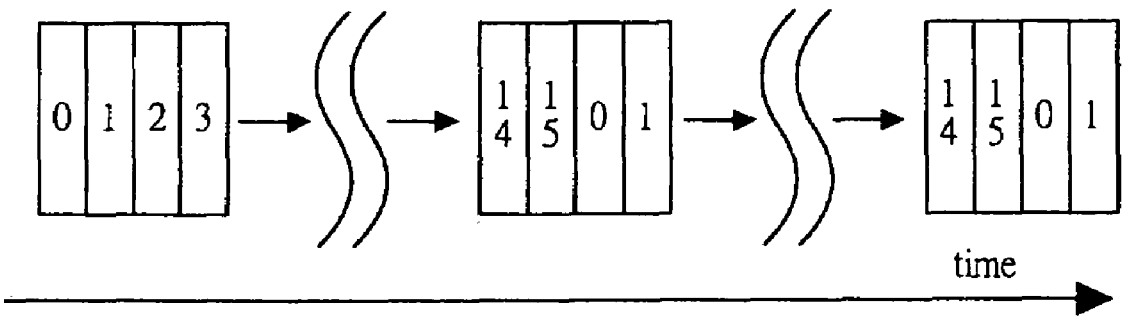
time

PLL CIRCUIT HAVING A MULTI-BAND OSCILLATOR AND COMPENSATING OSCILLATION FREQUENCY

This application is a continuation of U.S. patent application Ser. No. 10/373,020, filed Feb. 26, 2003 now U.S. Pat. No. 7,103,337, now allowed, which is incorporated by reference herein in its entirety.

CROSS-REFERENCES TO RELATED APPLICATIONS

The following applications, including this one, are being filed concurrently, and the disclosure of the other applications are incorporated by reference into this application in their entirety for all purposes:

U.K. Patent Application No. 0212737.1 (filed on May 31, 2002) entitled "APPARATUS FOR RADIO TELECOMMUNICATION SYSTEM AND METHOD OF BUILDING UP OUTPUT POWER"

U.K. Patent Application No. 0212725.6 (filed on May 31, 2002) entitled "A COMMUNICATION SEMICONDUCTOR INTEGRATED CIRCUIT, A WIRELESS COMMUNICATION APPARATUS, AND A LOOP GAIN CALIBRATION METHOD"

U.K. Patent Application No. 0212729.8 (filed on May 31, 2002) entitled "TRANSMITTER AND SEMICONDUCTOR INTEGRATED CIRCUIT FOR COMMUNICATION"

U.K. Patent Application No. 0212723.1 (filed on May 31, 2002) entitled "SEMICONDUCTOR INTEGRATED CIRCUIT FOR COMMUNICATION, RADIO-COMMUNICATIONS APPARATUS, AND TRANSMISSION STARTING METHOD"

U.K. Patent Application No. 0212735.5 (filed on May 31, 2002) entitled "SEMICONDUCTOR INTEGRATED CIRCUIT DEVICE FOR COMMUNICATION"

U.K. Patent Application No. 0212732.2 (filed on May 31, 2002) entitled "APPARATUS FOR MOBILE COMMUNICATION SYSTEM"

BACKGROUND OF THE INVENTION

The present invention relates to a technique effectively applied to a PLL (Phase Locked Loop) circuit in which a VCO (Voltage Controlled Oscillator) is provided and an oscillation frequency can be switched. For example, the present invention relates to a technique effectively used in a radio frequency integrated circuit device provided with a PLL circuit that generates an oscillation signal having a predetermined frequency to be synthesized with a received signal or a transmitted signal in a mobile communication device such as a mobile phone or the like capable of receiving/transmitting signals in multiple bands. Furthermore, the present invention relates to a technique effectively applied to a wireless communication system using this radio frequency integrated circuit device.

According to the examinations made by the inventors of the present invention, with respect to the wireless communication system such as a mobile phone or the like, techniques as shown below are known.

In the wireless communication system such as a mobile phone or the like, a PLL circuit is used as a local oscillator that generates an oscillation signal having a predetermined frequency to be synthesized with a received signal and a transmitted signal. Heretofore, a dual-band mobile phone is known, which can process the signals having two frequency bands, for example, a GSM (Global System for Mobile Communication) having a frequency band of 900 MHz and a DCS (Digital Cellular System) having a frequency band of 1800 MHz. Also, one type of the dual-band mobile phone can handle the two bands by one PLL circuit.

SUMMARY OF THE INVENTION

In recent years, with respect to the mobile phone as described above, a triple-band mobile phone has been demanded, which can process a signal of PCS (Personal Communication System) having a frequency band of 1900 MHz in addition to the GSM and the DCS, and a technique concerning such a triple-band mobile phone has been also proposed. It can be expected that demands for a mobile phone capable of handling more bands will be emphasized in the future.

In such a mobile phone capable of handling the multiple bands, the PLL circuit is an indispensable technology for obtaining a local oscillation signal having an optional frequency and the PLL circuit must be operated at a frequency based on the mobile phone to be used. A PLL circuit using a VCO that has multiple oscillation frequency bands and thus has a wide frequency range has been already proposed. This PLL circuit can compensate for the fluctuation of the VCO due to the variance of manufacture, by using the calibration function of its own. More specifically, even if the oscillation frequency of each band is not known exactly because of the variance of devices manufactured, the use of a automatic calibration function and an automatic band selection function make it possible to select the appropriate band.

However, as a result of examining the above-mentioned PLL circuit used in the mobile phone as a premise technique of the present invention, the inventors of the invention have found out the following matters.

(1) The oscillation frequency of the VCO fluctuates depending on the temperature. Therefore, the calibration table constructed by the automatic calibration at the time of switch-on depends on temperature and so comes to no optimum one. More specifically, after the switch-on, the temperature of the mobile phone changes as the temperature of the circuit therein increases, and even the date according to the calibration table constructed after the switch-on is thought to have some error. As a result, there is a possibility that the optimum band can not be selected at the time of the automatic band selection.

(2) With regard to the PLL circuit having multiple bands but not switching the band once the band is set, if the same sequence as that of the PLL circuit of (1) mentioned above is used, an occupied area thereof becomes increased and so this is not effective.

(3) The sensitivity of oscillation frequency vs tuning voltage of the VCO depends on the oscillation frequency band. Therefore, since the loop bandwidth of the PLL circuit is changed depending on the selected band, the design of the LPF (Loop Filter) or the like of the PLL circuit becomes difficult.

Thereupon, with respect to the PLL circuit for controlling the VCO having multiple oscillation frequency bands similarly to the above-mentioned PLL circuit serving as the premise technique of the present invention, while paying attention to the products such as a radio frequency integrated circuit device (hereinafter, referred to as RFIC) or the like having a PLL circuit or the like formed therein, the inventors of the present invention have conceived such things as shown below, which relate to the items to be important at the stage of production such as an operation compensation by the temperature, and a chip area, and a performance margin.

More specifically, in the product such as the RFIC or the like, it is necessary to compensate for the frequency variance due to temperature change or change in characteristics with time. Also, in the PLL circuit which has multiple oscillation frequency bands in order to inhibit the increase in the chip area and which, once a band is set, does not switch the band, it is necessary to change the algorithm. Furthermore, it is necessary to improve the performance of a synthesizer and to ensure the performance margin by compensating for the fluctuation of the sensitivity of the VCO frequency vs tuning voltage, which depends on the oscillation frequency band.

Therefore, an object of the present invention is to provide a semiconductor integrated circuit device for communication such as an RFIC or the like having a PLL circuit or the like that controls a VCO having multiple oscillation frequency bands and that is capable of realize the compensation of operation due to temperature change, the inhibition of increase in the chip area, and the ensurement of the performance margin, with taking the products such as an RFIC or the like in consideration.

The above and other objects and novel characteristics of the present invention will be apparent from the description of the specification and the accompanying drawings.

The typical aspects of the inventions disclosed in this application will be briefly described as follows.

More specifically, the present invention is applied to the semiconductor integrated circuit device for communication, the device including a PLL circuit which has a VCO constituted to be capable of oscillation and operation in multiple frequency bands; a phase comparator for detecting the phase difference between a feedback signal from this VCO and a frequency signal used as a reference; a charge pump for generating a current in response to the phase difference detected by this phase comparator and supplying the current to to the VCO, and which is capable of outputting an oscillation signal having a frequency corresponding to specified frequency information, and the present invention has characteristics as follows.

(1) The present invention has, as a tuning voltage of the VCO, a DC voltage source for generating a DC voltage having reverse dependence to dependence of this VCO in frequency relative to temperature in the case where the frequency of this VCO increases with increasing of the VCO tuning voltage, or a DC voltage source for generating a DC voltage having the same dependence as dependence of this VCO in frequency relative to temperature in the case where the frequency of this VCO decreases conversely with increasing the VCO tuning voltage, and thereby performs calibration after this DC voltage source is connected to the VCO; oscillates and operates the VCO in accordance with a DC voltage supplied from the DC voltage source; measures this oscillation frequency per each frequency band of the VCO by the frequency counter; and memorizes the oscillation frequency in the memory circuit. By this constitution, even in the case where the oscillation frequency of each of the frequency bands is changed due to temperature change, the appropriate frequency band can be selected.

(2) The present invention has a DC voltage source for generating a predetermined DC voltage as a tuning voltage of the VCO, and thereby performs recalibration after the VCO is connected to the DC voltage source; oscillates and operates the VCO in accordance with a DC voltage supplied from the DC voltage source; measures an error of a first frequency band out of all frequency bands of the VCO by the oscillation counter when this oscillation frequency is measured; estimates, from the error, errors of the other frequency bands; and memorizes the errors in the memory circuit. Or, the present invention measures errors of all frequency bands of the VCO per temporal decomposition in turn, and memorizes the errors in the memory circuit. By such a constitution, even in the case where the oscillation frequency of each of the frequency bands is changed due to temperature change, the appropriate frequency band can be selected.

(3) The present invention has a DC voltage source for generating a predetermined DC voltage as a tuning voltage of said VCO, and thereby performs calibration after the VCO is connected to the DC voltage source; oscillates and operates the VCO in accordance with a DC voltage supplied from the DC voltage source; measures this oscillation frequency per each of frequency bands of the VCO by the frequency counter; and selects a frequency band near a target frequency. In this case, errors are calculated between values measured per each of the frequency bands of the VCO and target values of the target frequency, and a frequency band having the smallest error is selected. Or, the comparison is performed between values measured per each of the frequency bands of the VCO and a target value of said target frequency, and a frequency band is selected which has first a value equal to or less than, or a value equal to or more than the target value. By such a constitution, in the PLL circuit in which the switching of the frequency band that has been once determined is not required, the occupied area thereof can be reduced.

(4) The present invention performs calibration in such a state that the PLL circuit is a closed loop, and oscillates and operates the VCO at a target frequency to measure this tuning voltage per each of frequency bands of the VCO, and selects a frequency band having a value that is near a threshold value corresponding to the target frequency. Or, the present invention selects a frequency band that is within a range between two threshold values corresponding to the target frequency. By such a constitution, in the PLL circuit in which the switching of the frequency band that has been once determined is not required, the occupied area can be reduced.

(5) The present invention has a memory circuit for memorizing tuning sensitivity information showing dependence of frequency relative to a tuning voltage per each of frequency bands of the VCO, and controls a current value of the charge pump at the time of selecting each of the frequency bands of the VCO, in order to compensate for the dependence of the frequency relative to the tuning voltage on the basis of the tuning sensitivity information memorized in the memory circuit when the selected frequency band is compensated for. By such a constitution, in the case where the sensitivity of the frequency differs relative to the tuning voltage depending on the frequency band, the bandwidth of the PLL circuit can be compensated for to become constant by switching the current of the charge pump.

BRIEF DESCRIPTIONS OF THE DRAWINGS

Figure 5:
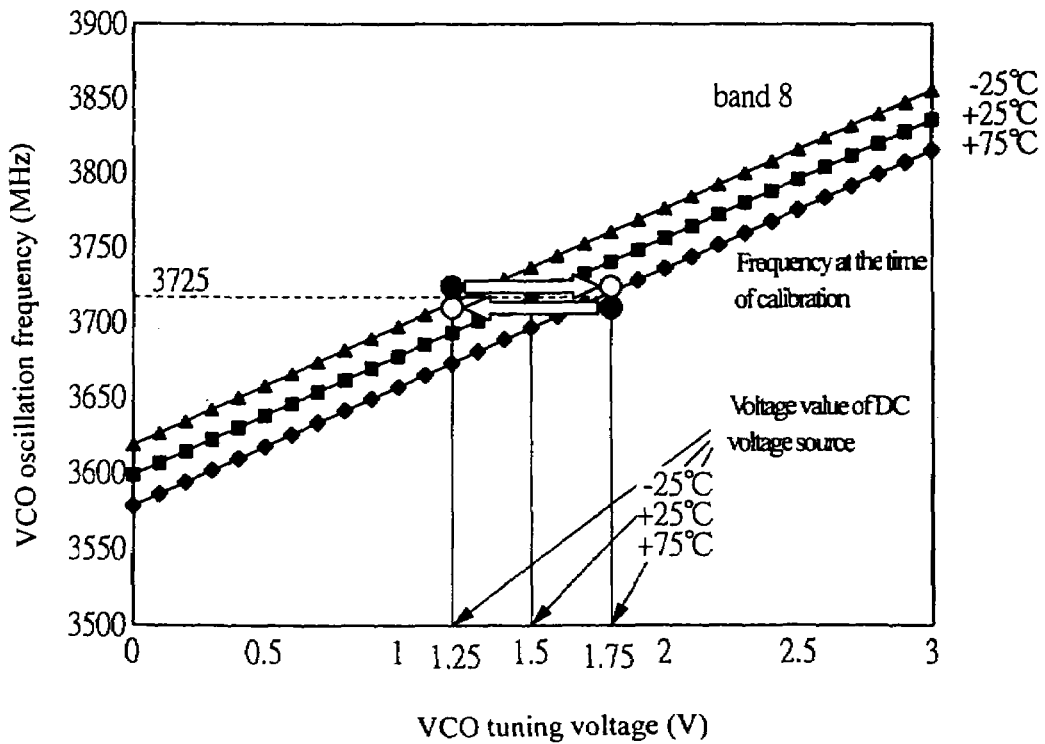

FIG. 5 is an explanatory diagram showing the change in the VCO oscillation frequency vs tuning voltage characteristic relative to temperature and showing temperature change of a DC voltage source, in a method of minimizing the influence on the fluctuation of the VCO oscillation frequency due to temperature change at the time of an automatic band selection according to an embodiment of the present invention.

Figure 6:
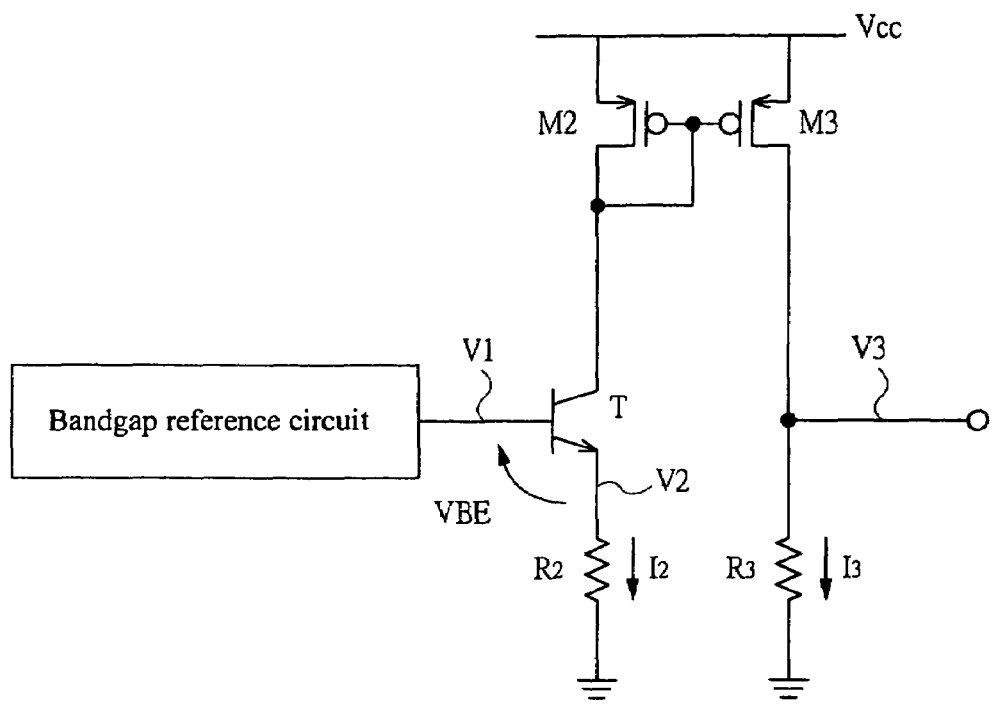

FIG. 6 is a block diagram of the circuit of a DC voltage source having a positive temperature characteristic according to an embodiment of the present invention.

Figure 7:
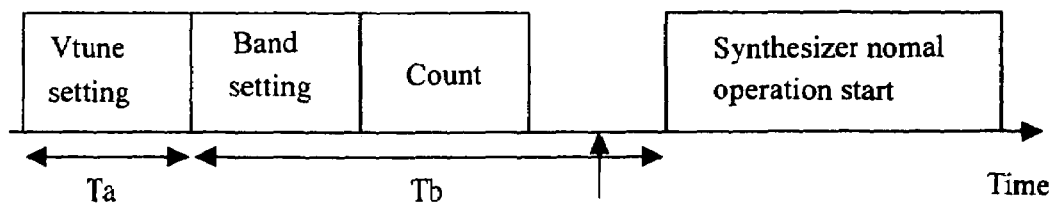

FIG. 7 is a timing diagram showing recalibration, in a method of executing the recalibration according to an embodiment of the present invention.

Figure 8:
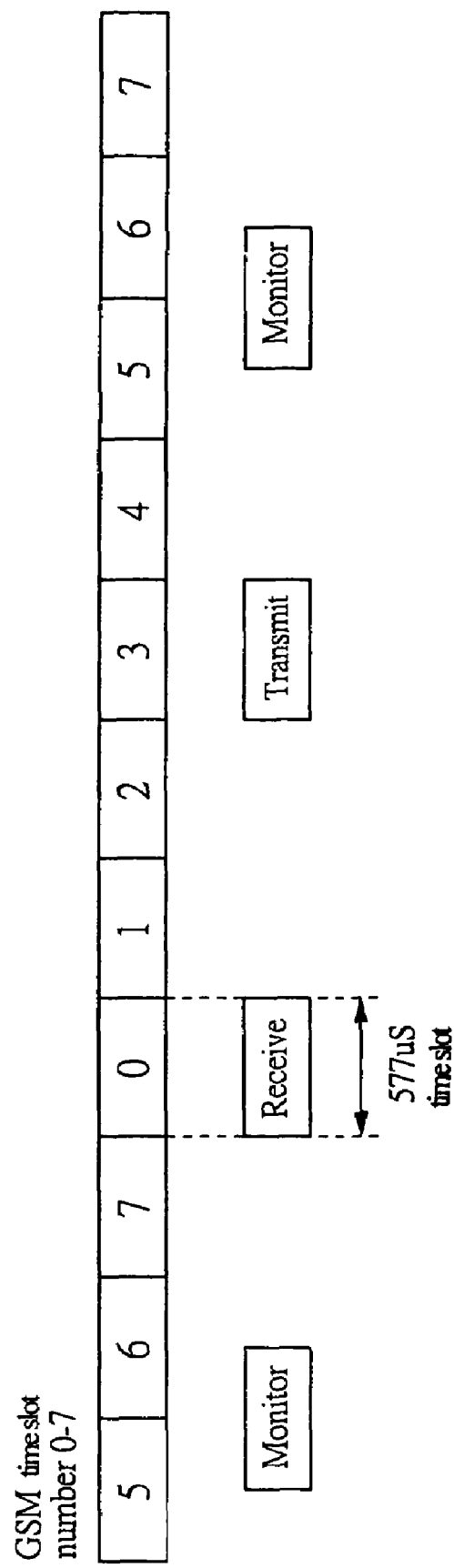

FIG. 8 is a timing diagram showing GSM, in a method of executing the recalibration according to an embodiment of the present invention.

FIG. 9 is an explanatory diagram showing the number of the recalibrations and that of the TDMA frames, in a method of executing the recalibration according to an embodiment of the present invention.

Figure 10:
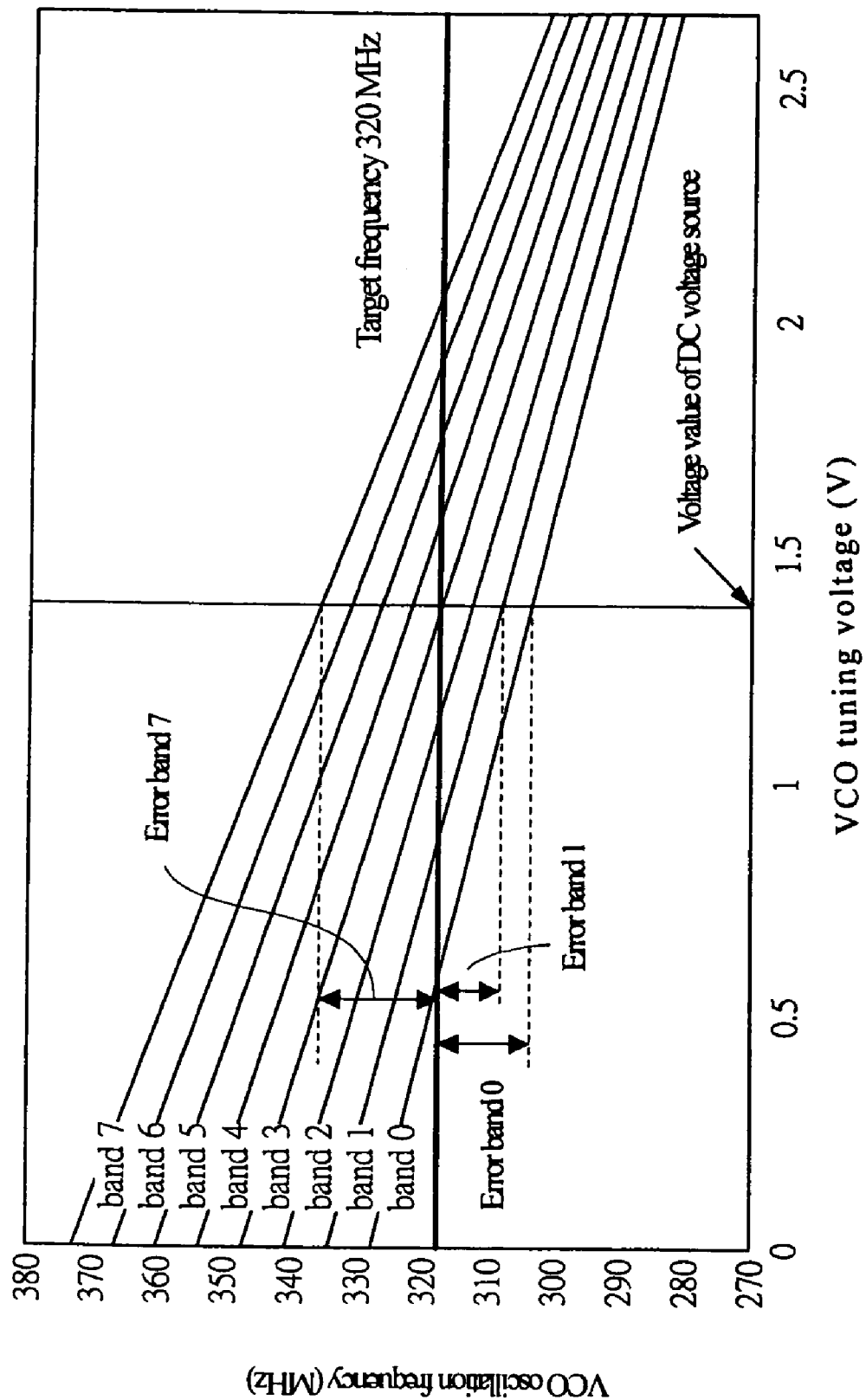

FIG. 10 is an explanatory diagram showing an error of a target frequency in the characteristic of the VCO oscillation frequency vs the VCO tuning voltage, in a method of calculating the error of a target frequency according to an embodiment of the present invention.

Figure 11:
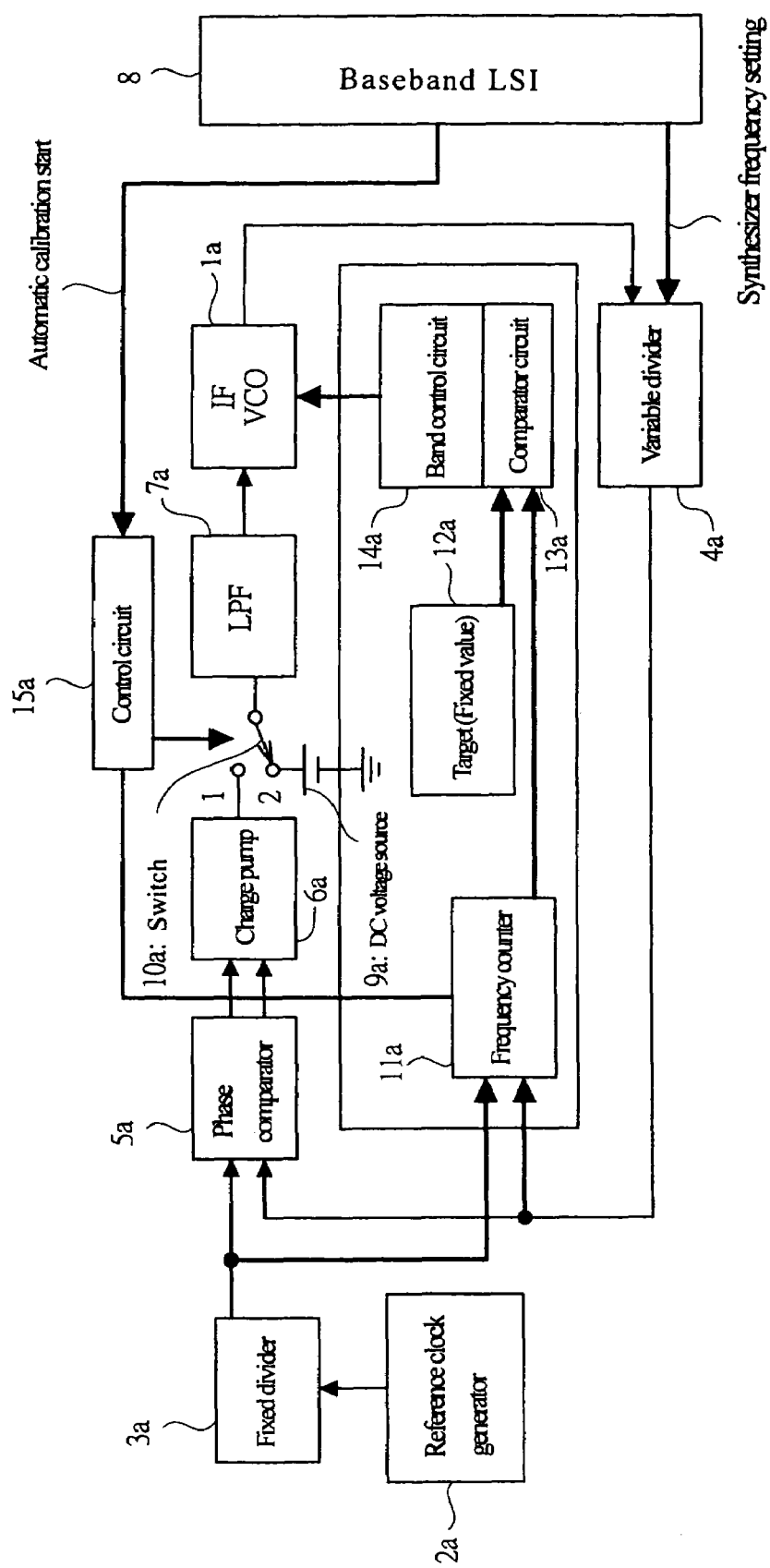

FIG. 11 is a block diagram of a PLL circuit using an IFVCO for explaining an automatic calibration, in a method of calculating the error of a target frequency according to an embodiment of the present invention.

Figure 12:
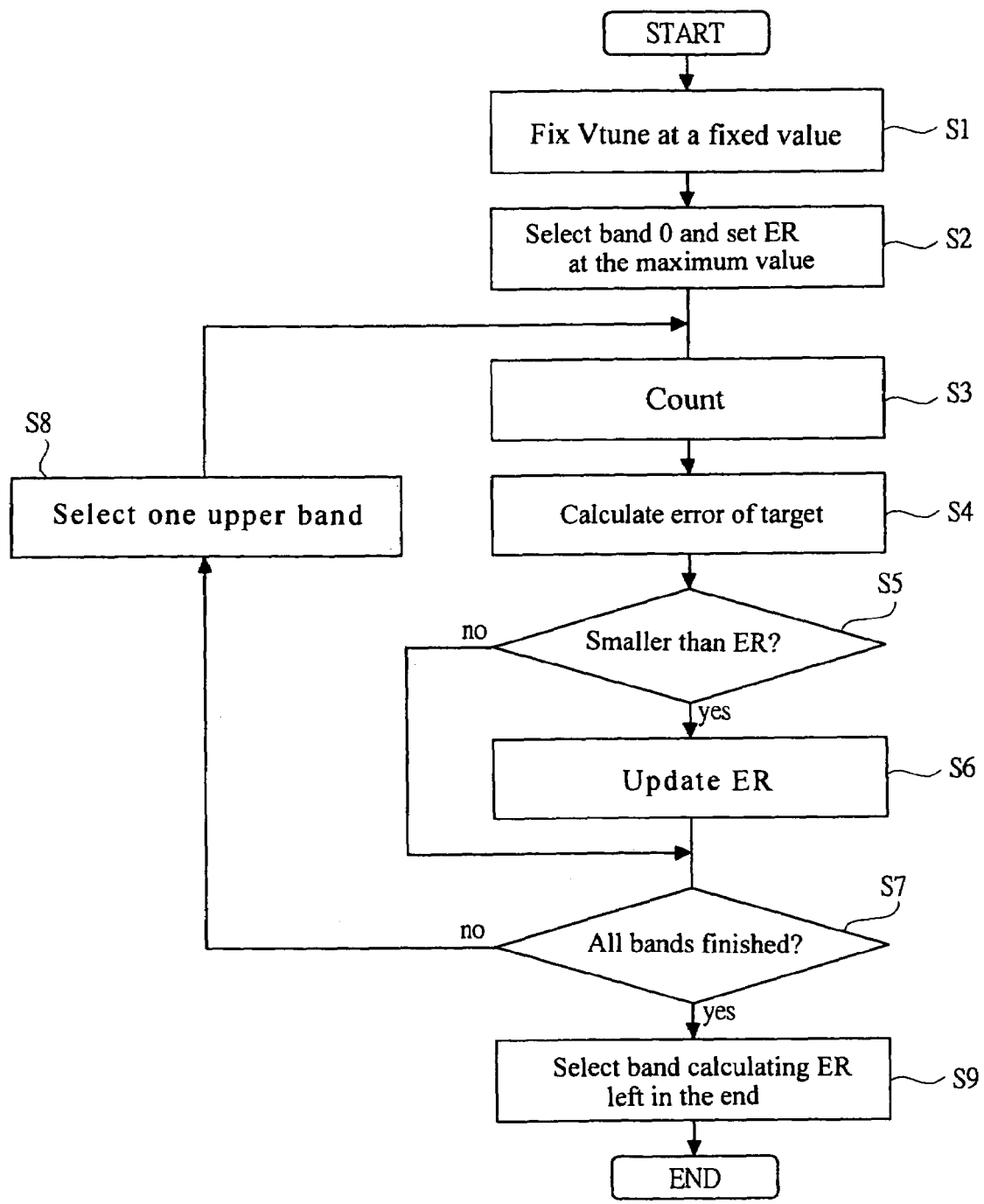

FIG. 12 is a flow chart of the calibration of an IFVCO, in a method of calculating the error of a target frequency according to an embodiment of the present invention.

Figure 13:
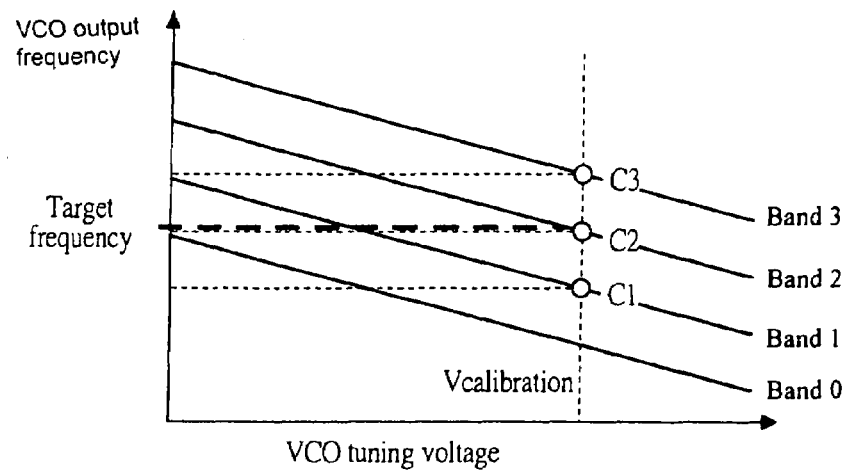

FIG. 13 is an explanatory diagram showing the level comparison of a target frequency in the characteristic of the VCO oscillation frequency vs the VCO tuning voltage, in a method of comparing in level the target frequency according to an embodiment of the present invention.

Figure 14:
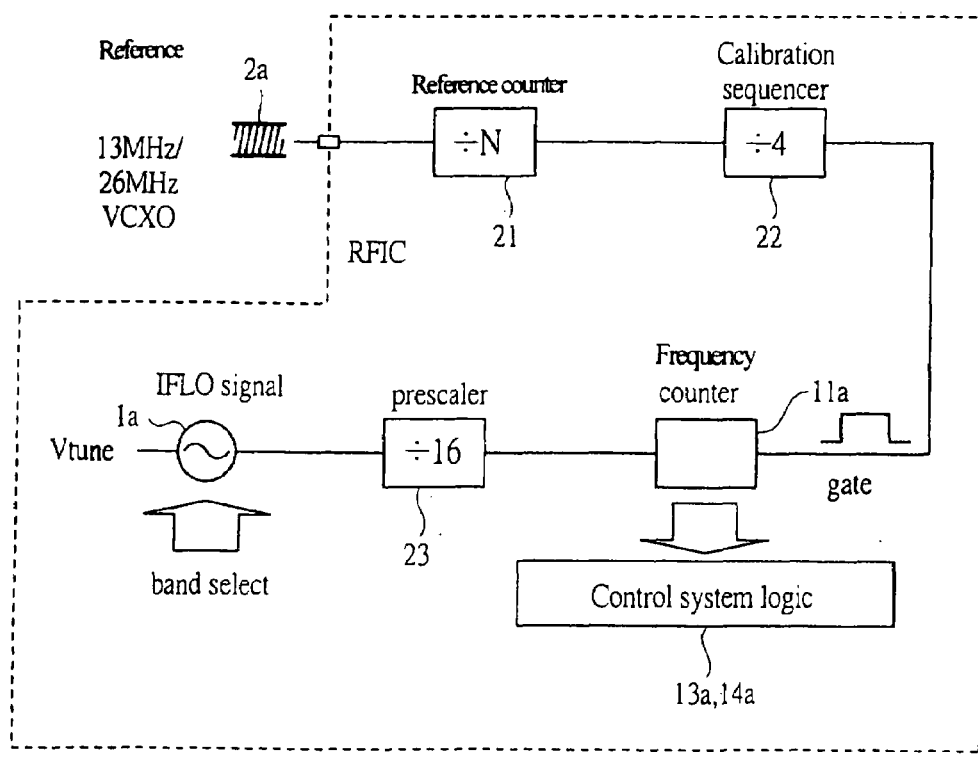

FIG. 14 is a block diagram of a calibration circuit block, in a method of comparing in level the target frequency according to an embodiment of the present invention.

Figure 15:
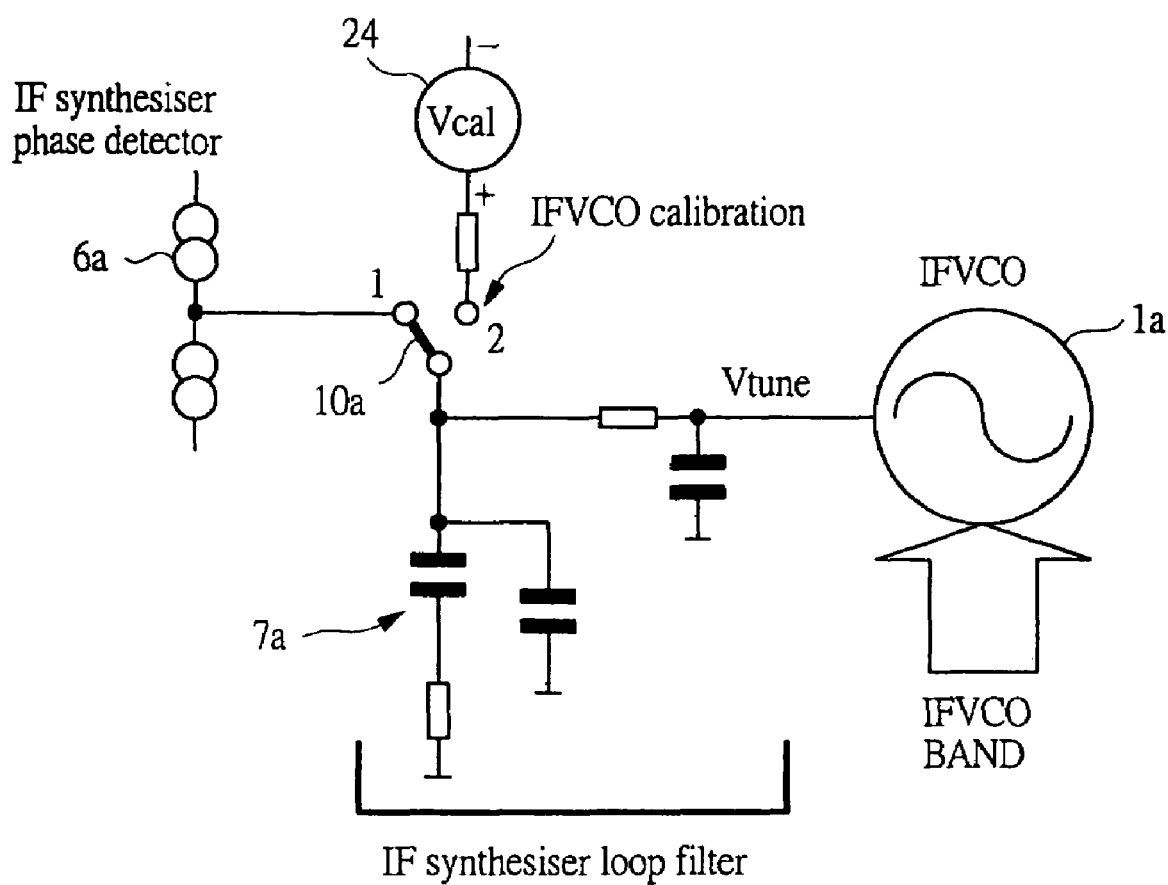

FIG. 15 is a block diagram showing the case of using a voltage source, in a method of comparing in level a target frequency according to an embodiment of the present invention.

Figure 16:
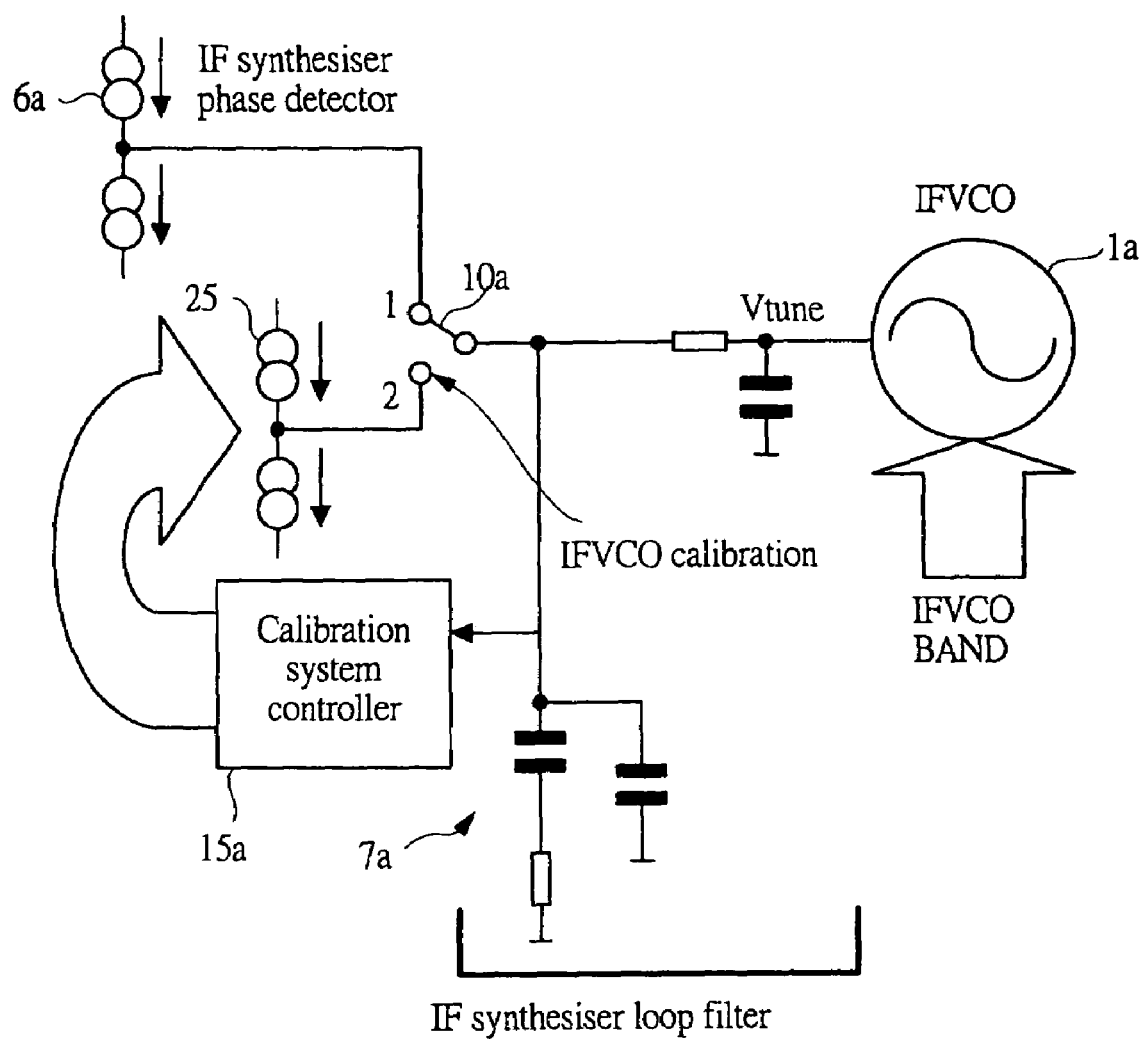

FIG. 16 is a block diagram showing the case of using a current source, in a method of comparing in level a target frequency according to an embodiment of the present invention.

Figure 17:
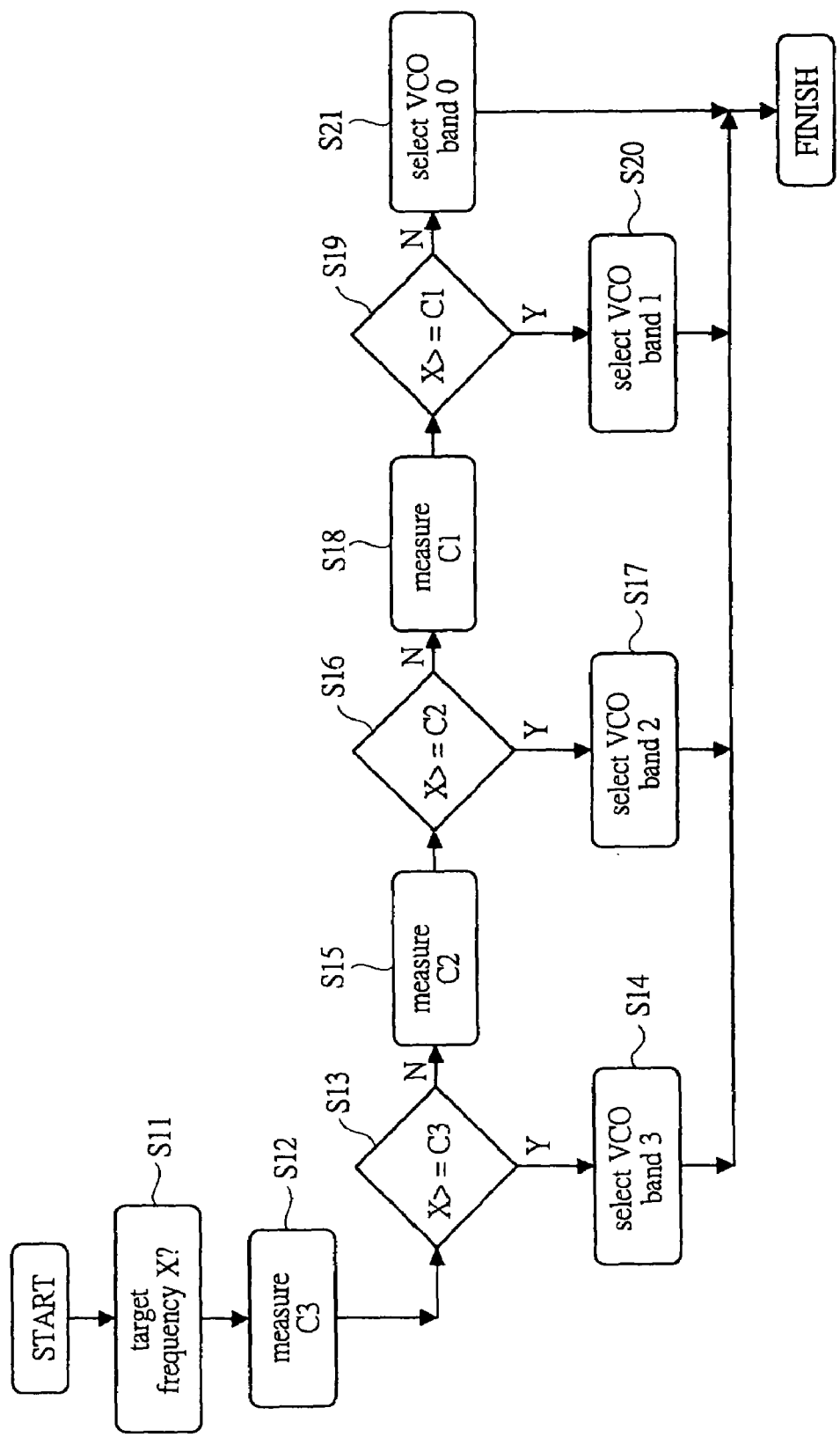

FIG. 17 is a flow chart showing an automatic calibration, in a method of comparing in level a target frequency according to an embodiment of the present invention.

Figure 18:
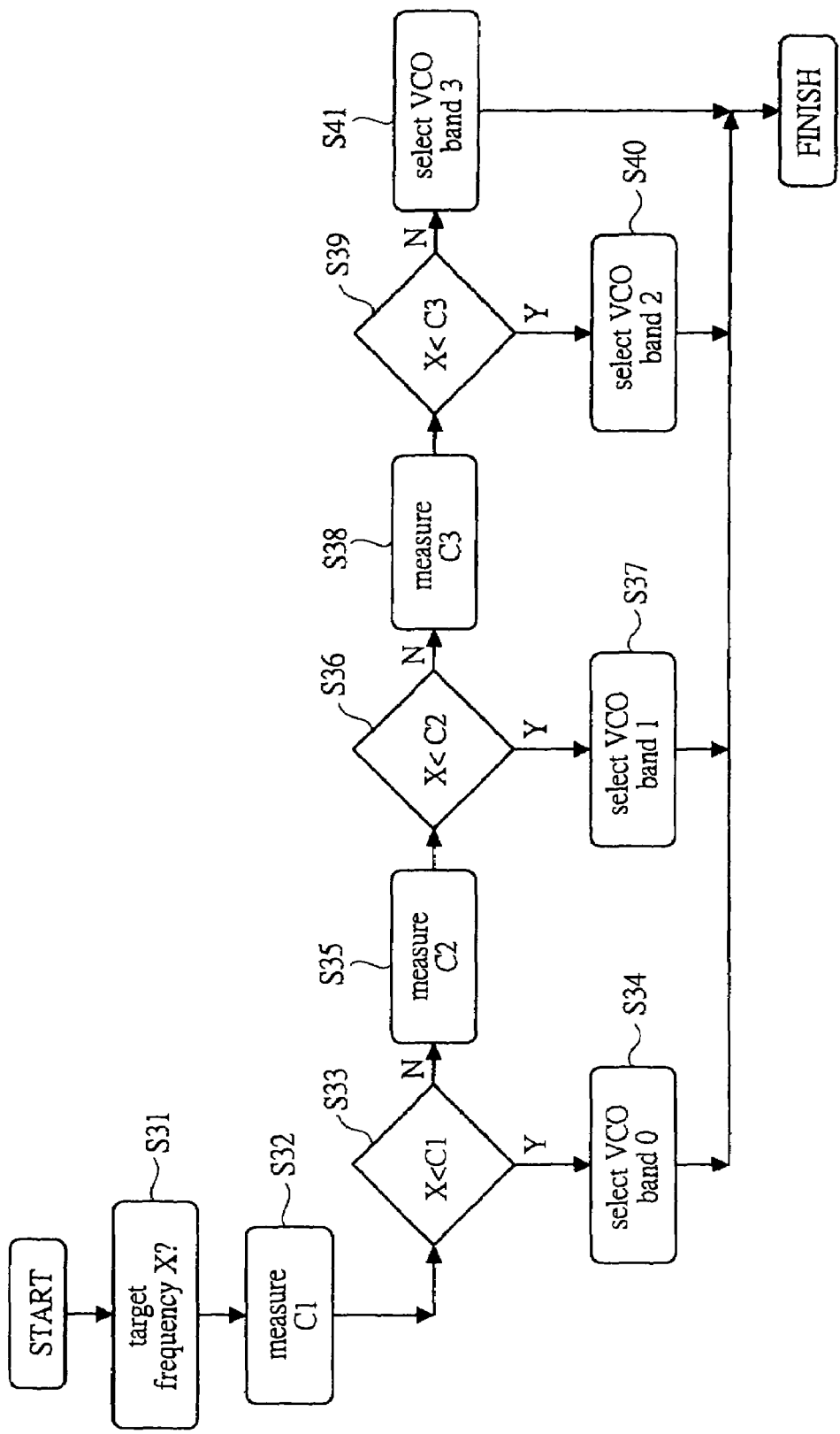

FIG. 18 is a flow chart showing another automatic calibration, in a method of comparing in level a target frequency according to an embodiment of the present invention.

Figure 19:
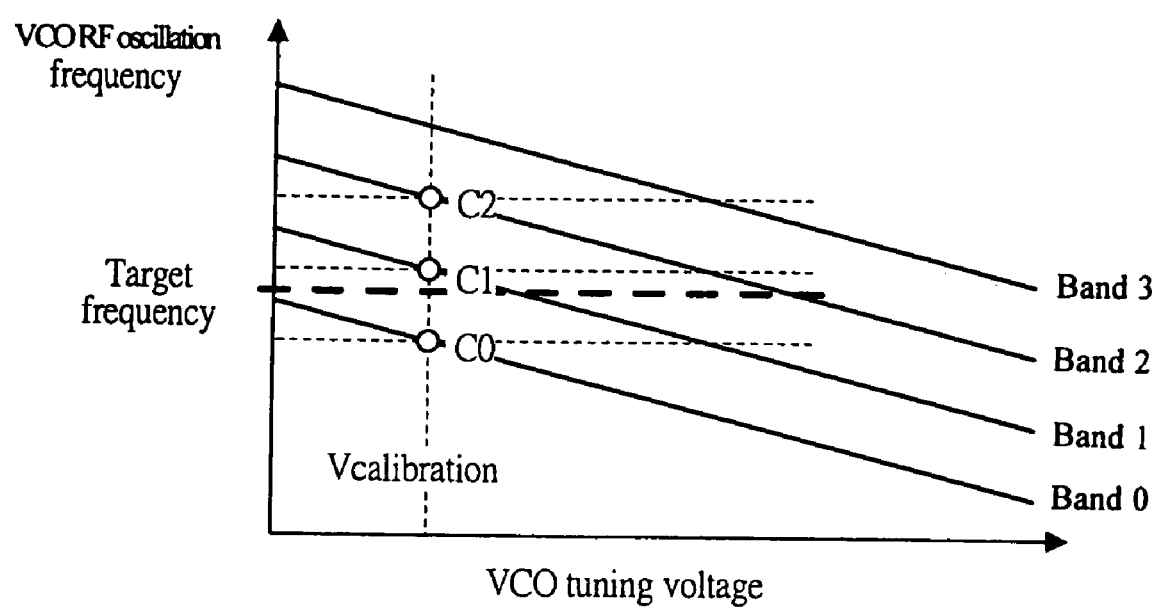

FIG. 19 is an explanatory diagram showing the level comparison with another target frequency in the characteristic of the VCO oscillation frequency vs the VCO tuning voltage, in a method of comparing in level a target frequency according to an embodiment of the present invention.

Figure 20:
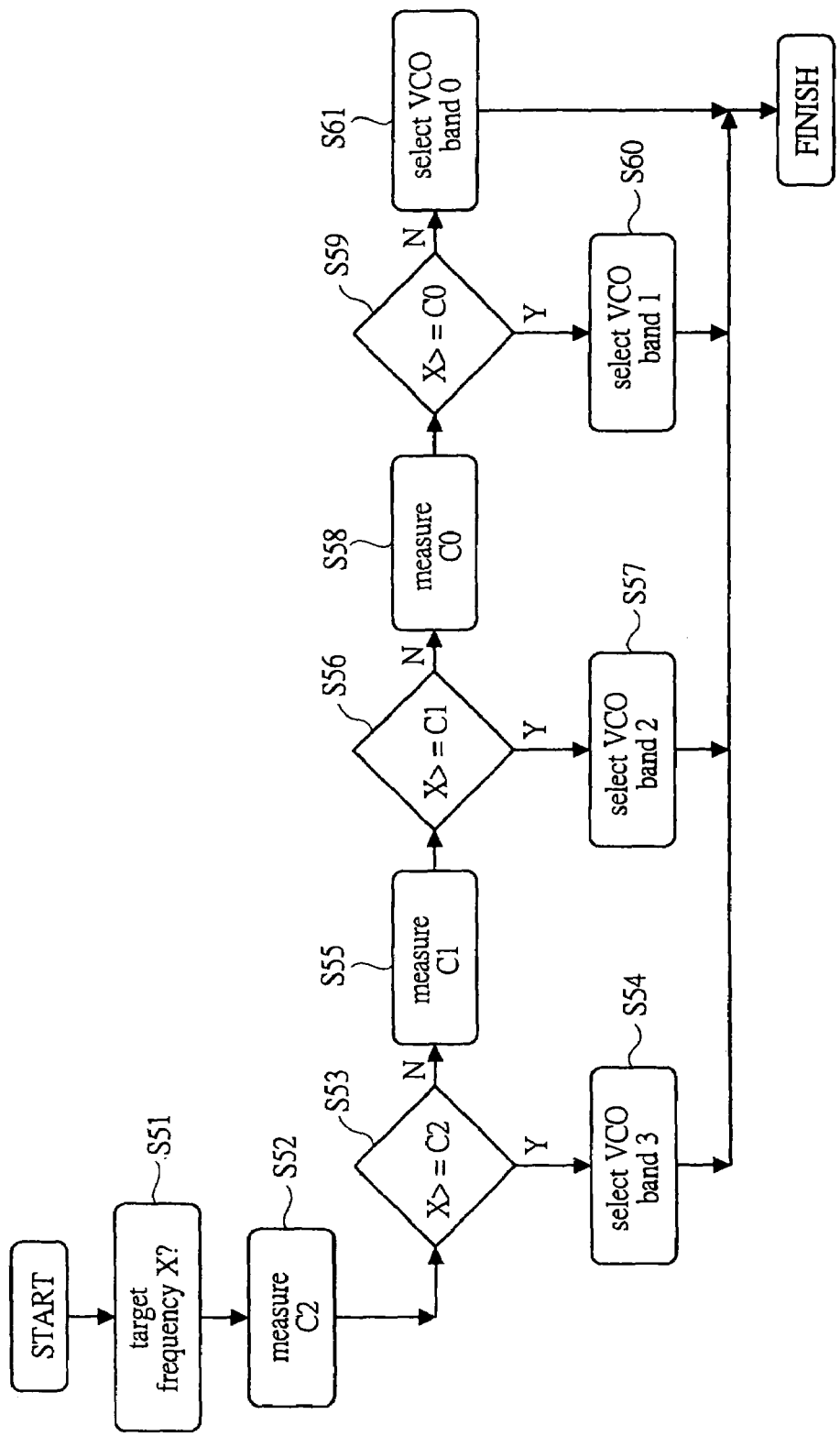

FIG. 20 is a flow chart showing still another automatic calibration, in a method of comparing in level a target frequency according to an embodiment of the present invention.

Figure 21:
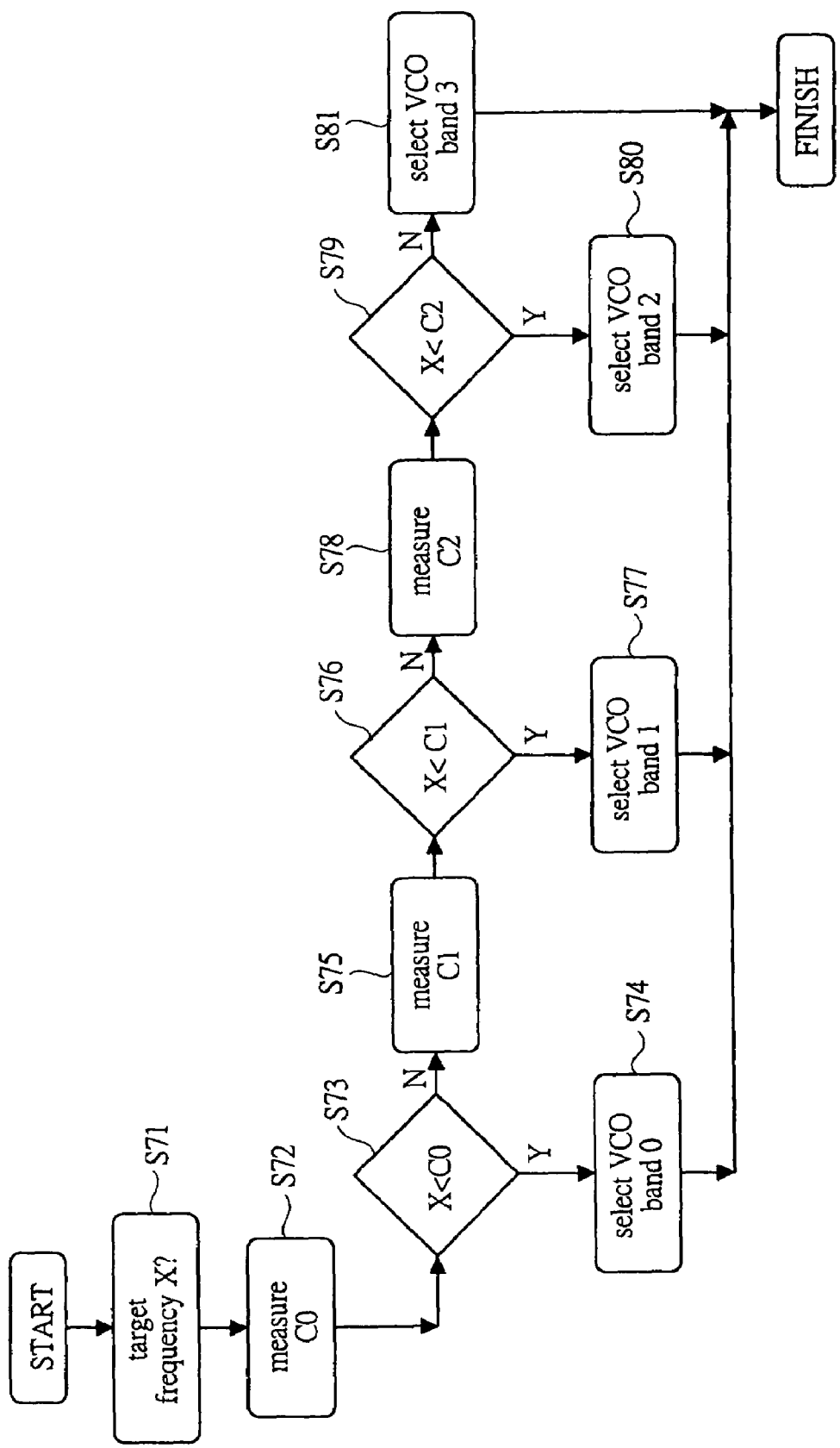

FIG. 21 is a flow chart showing still another automatic calibration, in a method of comparing in level a target frequency according to an embodiment of the present invention.

Figure 22:
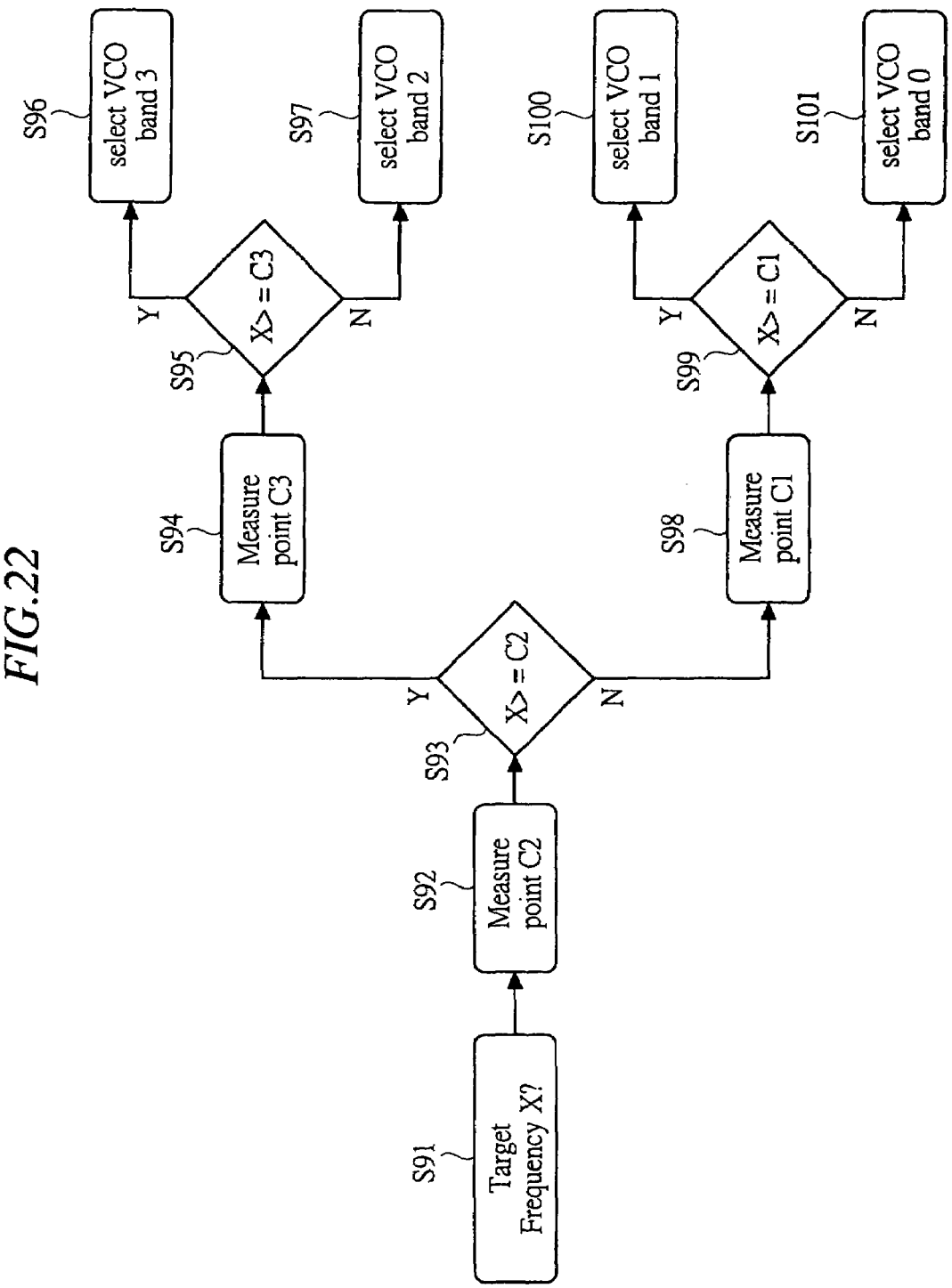

FIG. 22 is a flow chart showing still another automatic calibration, in a method of comparing in level a target frequency according to an embodiment of the present invention.

Figure 23:
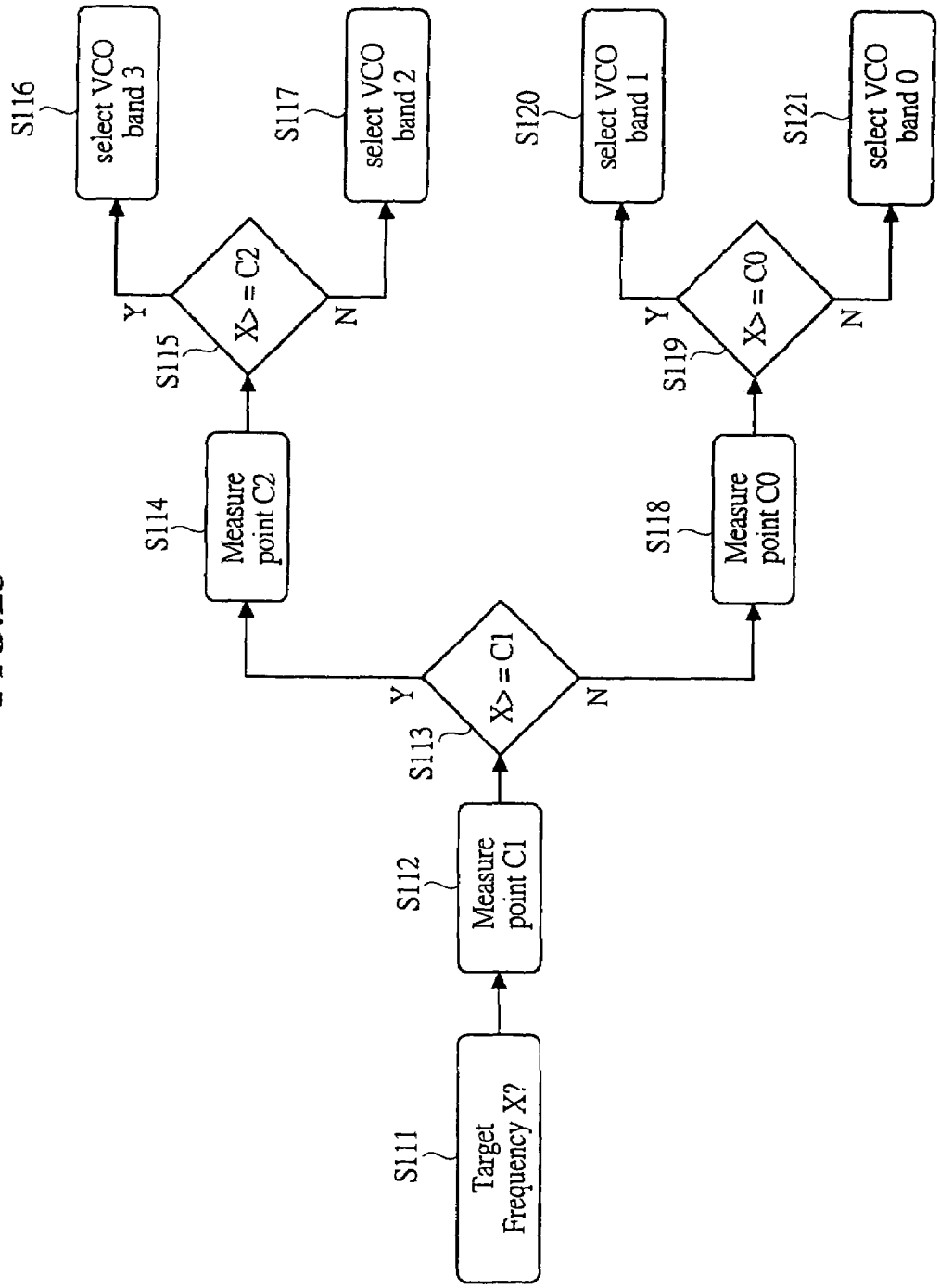

FIG. 23 is a flow chart showing still another automatic calibration, in a method of comparing in level a target frequency according to an embodiment of the present invention.

Figure 24:
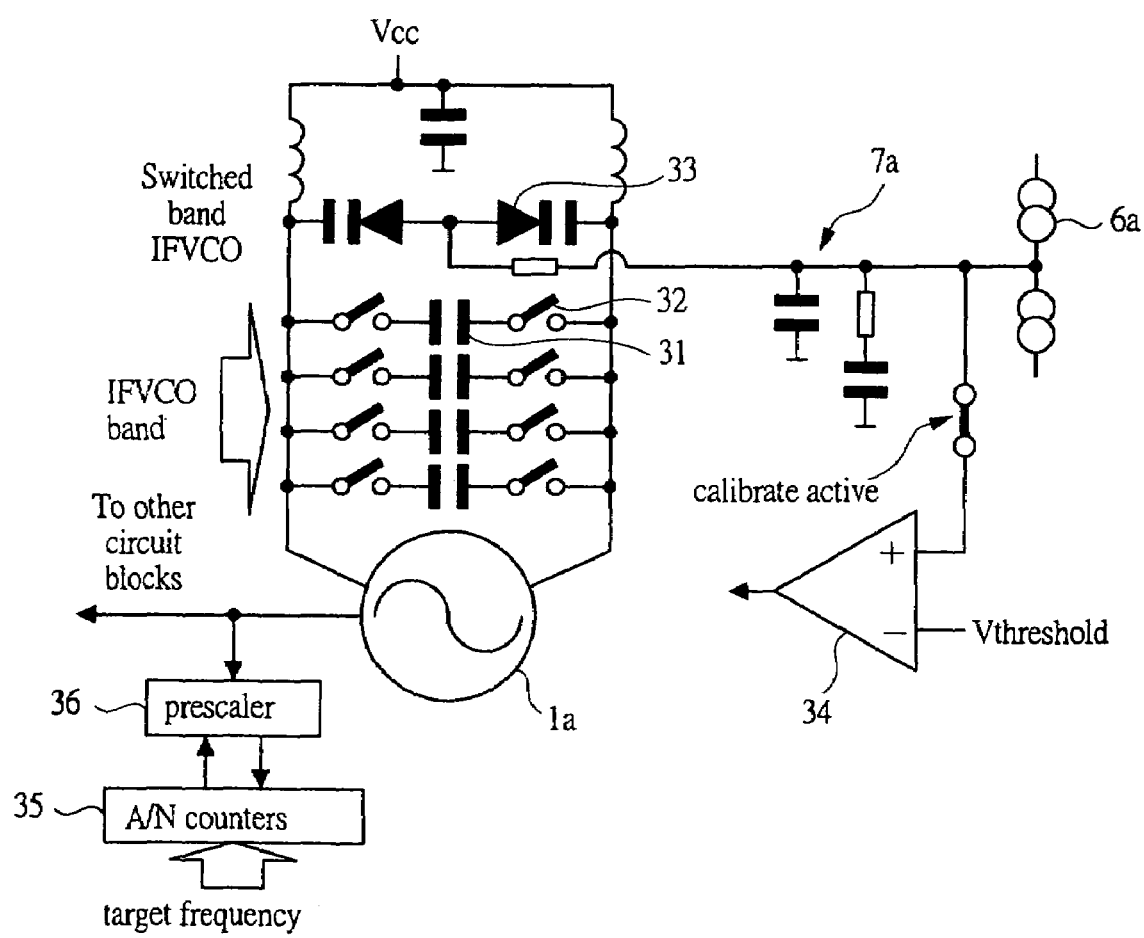

FIG. 24 is a block diagram showing a calibration circuit block, in a method of measuring a VCO tuning voltage according to an embodiment of the present invention.

Figure 25:
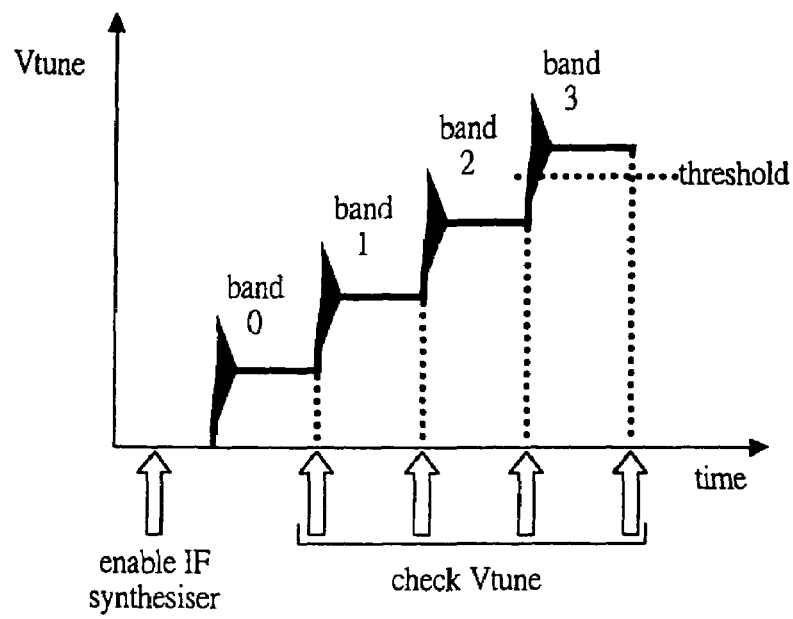

FIG. 25 is a timing diagram showing an automatic calibration, in a method of measuring a VCO tuning voltage according to an embodiment of the present invention.

Figure 26:
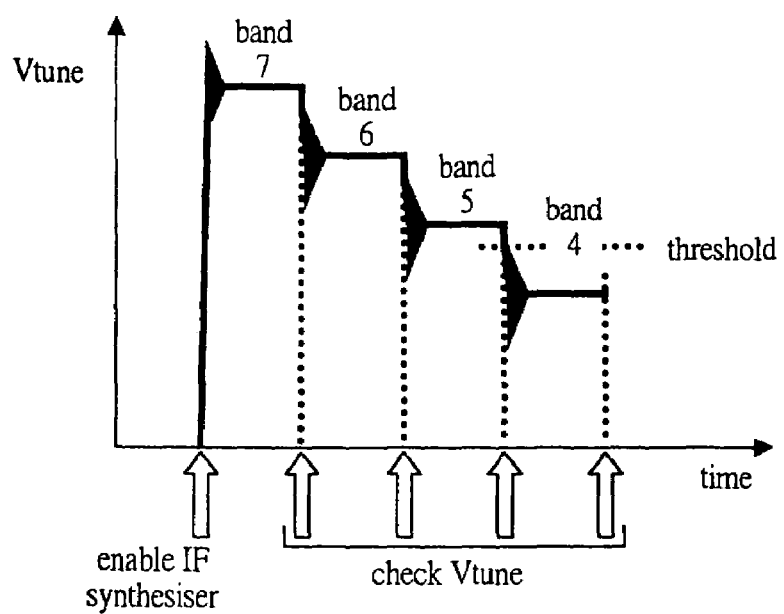

FIG. 26 is a timing diagram of another automatic calibration, in a method of measuring a VCO tuning voltage according to an embodiment of the present invention.

Figure 27:
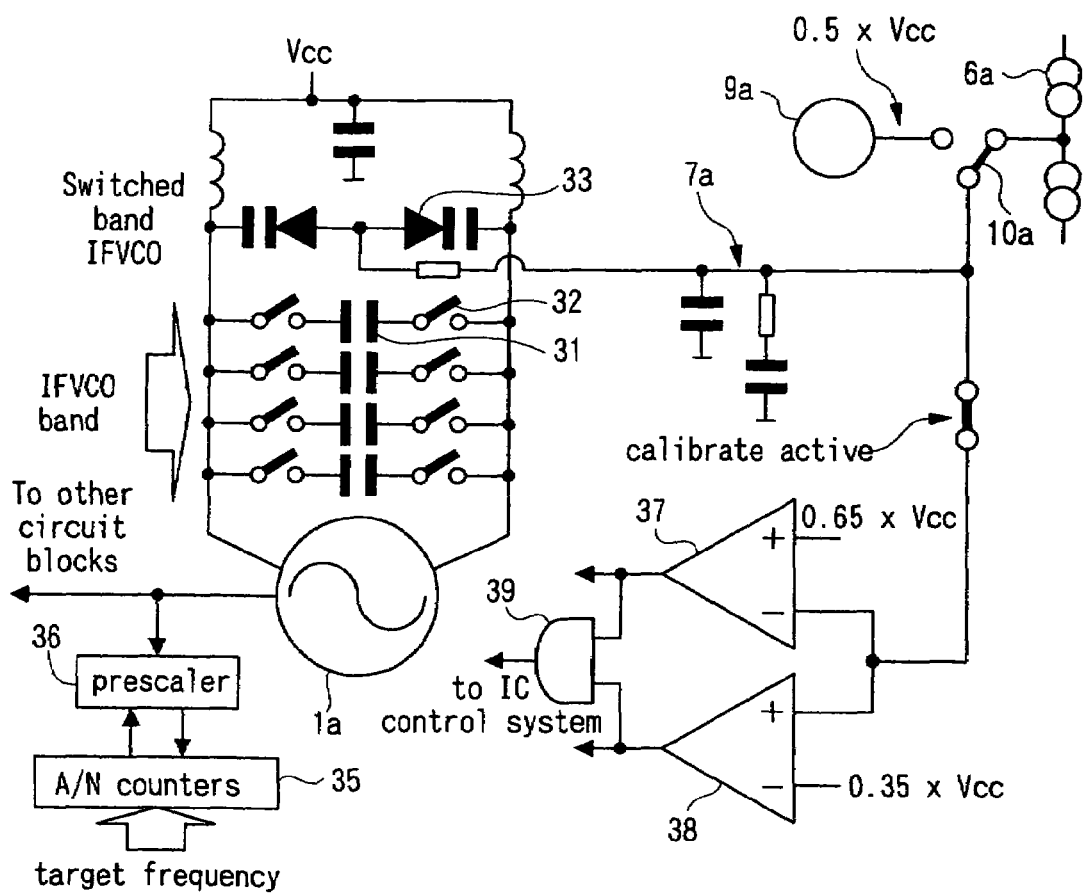

FIG. 27 is a block diagram of a calibration circuit block, in a method of measuring another VCO tuning voltage according to an embodiment of the present invention.

Figure 28:
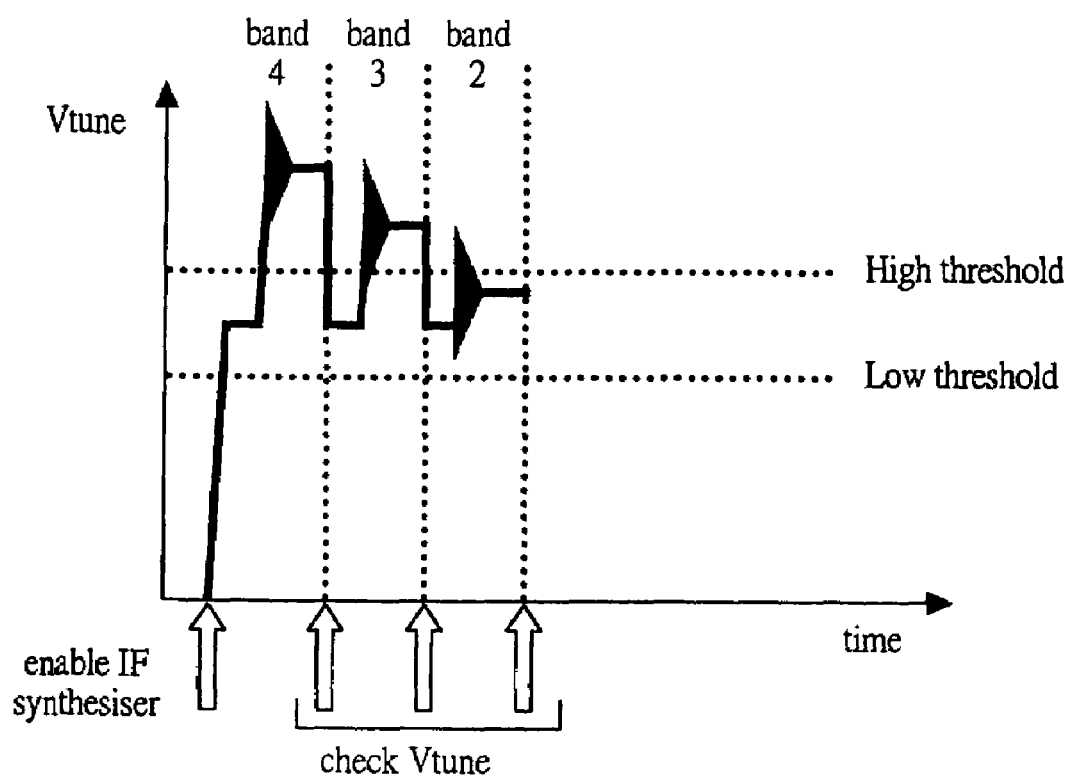

FIG. 28 is a timing diagram of an automatic calibration, in another method of measuring a VCO tuning voltage according to an embodiment of the present invention.

Figure 29:
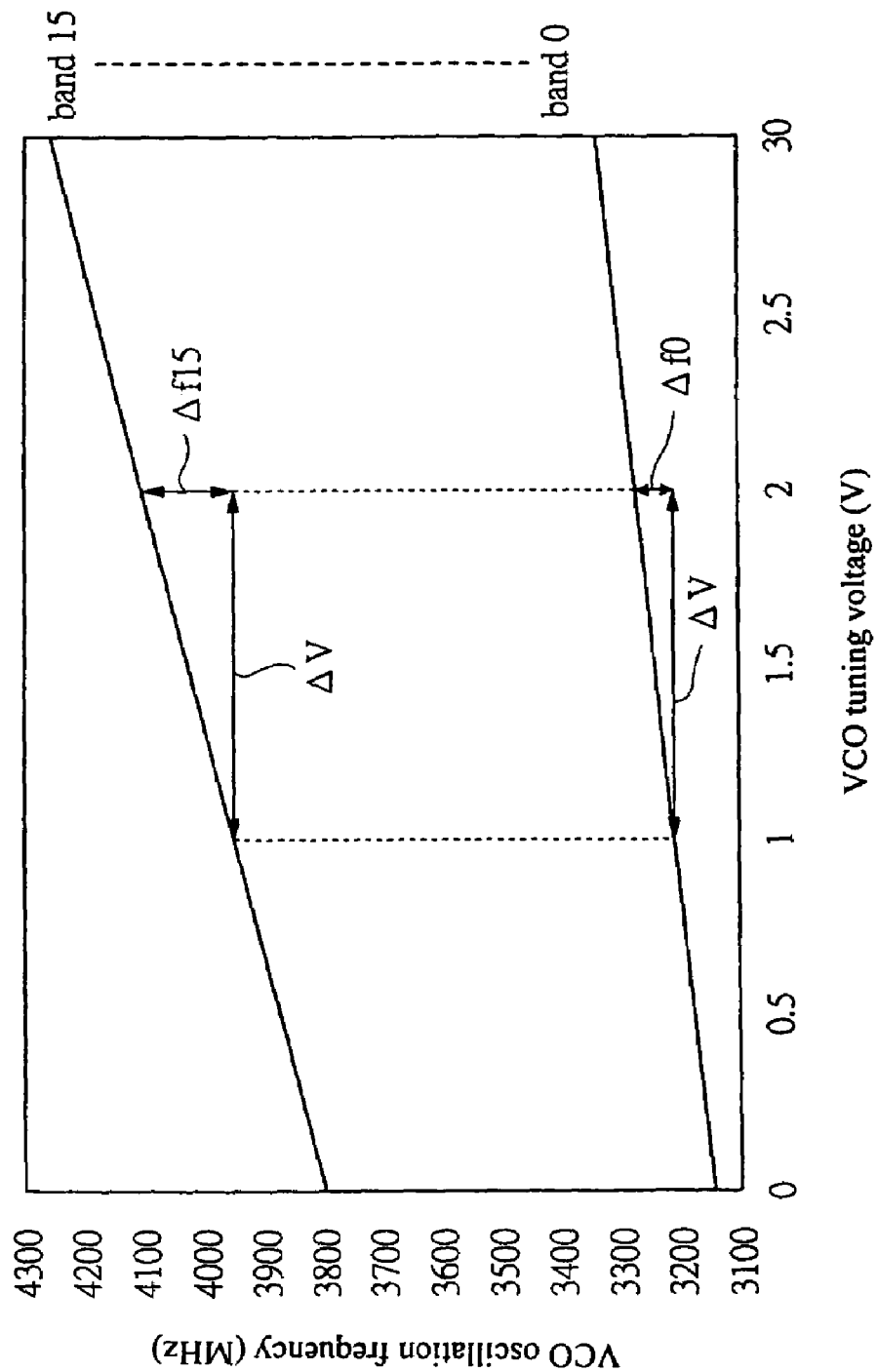

FIG. 29 is an explanatory diagram showing the band dependence in the sensitivity of the VCO oscillation frequency vs the VCO tuning voltage, in a method of switching the current value of a charge pump by a band according to an embodiment of the present invention.

Figure 30:
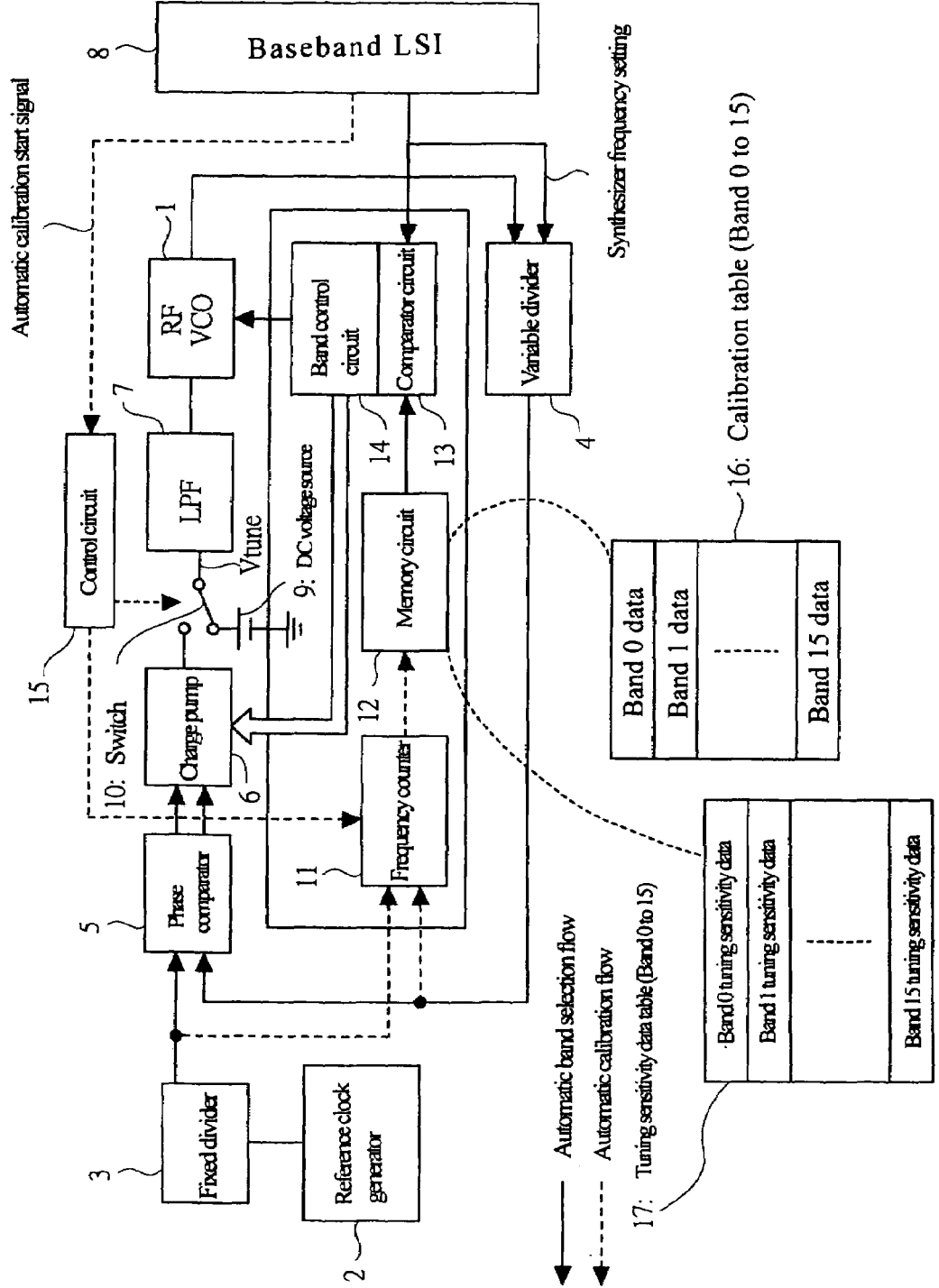

FIG. 30 is a block diagram showing a PLL circuit having multiple oscillation bands and including a control function for switching the current of a charge pump, in a method of switching the current value of a charge pump by a band according to an embodiment of the present invention.

Figure 31:
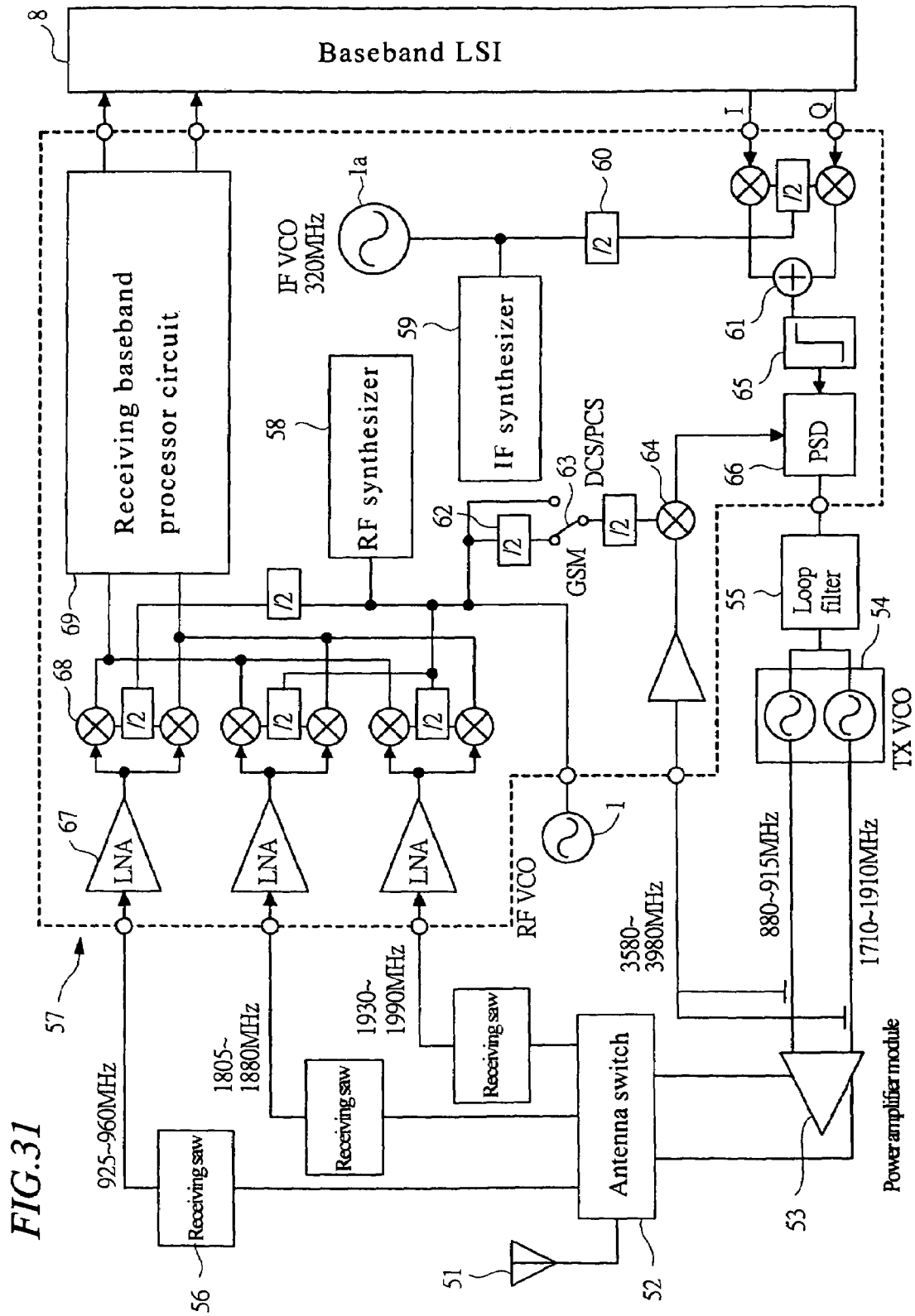

FIG. 31 is a block diagram showing a multi-band type mobile phone including an RFIC applying a PLL circuit therein, in an embodiment of the present invention.

DESCRIPTIONS OF THE PREFERRED EMBODIMENTS

Hereinafter, embodiments of the present invention will be described in detail based on the accompanying drawings. Note that components having the same function are denoted by the same reference symbol throughout all the drawings for describing the embodiments, and the repetitive description thereof will be omitted.

A PLL circuit to which the present invention is applied is used as a PLL synthesizer for controlling the VCO having multiple oscillation frequency bands. The PLL circuit has an automatic calibration function including a calibration at the time of switch-on and a recalibration after the switch-on, and an automatic band selection function for selecting an optimum oscillation frequency band based on a target frequency. Also, the PLL circuit can achieve the following: 1. Operating compensation due to temperature change, 2. Inhibition of the increase in the chip area, and 3. Ensurement of a performance margin. Each of them will be described below.

1. Operating Compensation Due to a Temperature Drift

In the PLL circuit, the oscillation frequency of the VCO fluctuates depending on temperature. Therefore, the calibration table constructed by the automatic calibration at the time of the switch-on comes to no optimum one due to the temperature change. Thus, the PLL circuit serving as the premise technique of the present invention has a possibility that it can not select the appropriate band. For its solution, in the present invention, two methods, namely, "1-1. A method of minimizing the influence exerted by the fluctuation of a VCO oscillation frequency due to temperature change at the time of an automatic band selection" and "1-2. A method of performing a recalibration" are implemented.

1-1. A method of minimizing the influence exerted by the fluctuation of the VCO oscillation frequency due to temperature change at the time of an automatic band selection.

Figure 1:
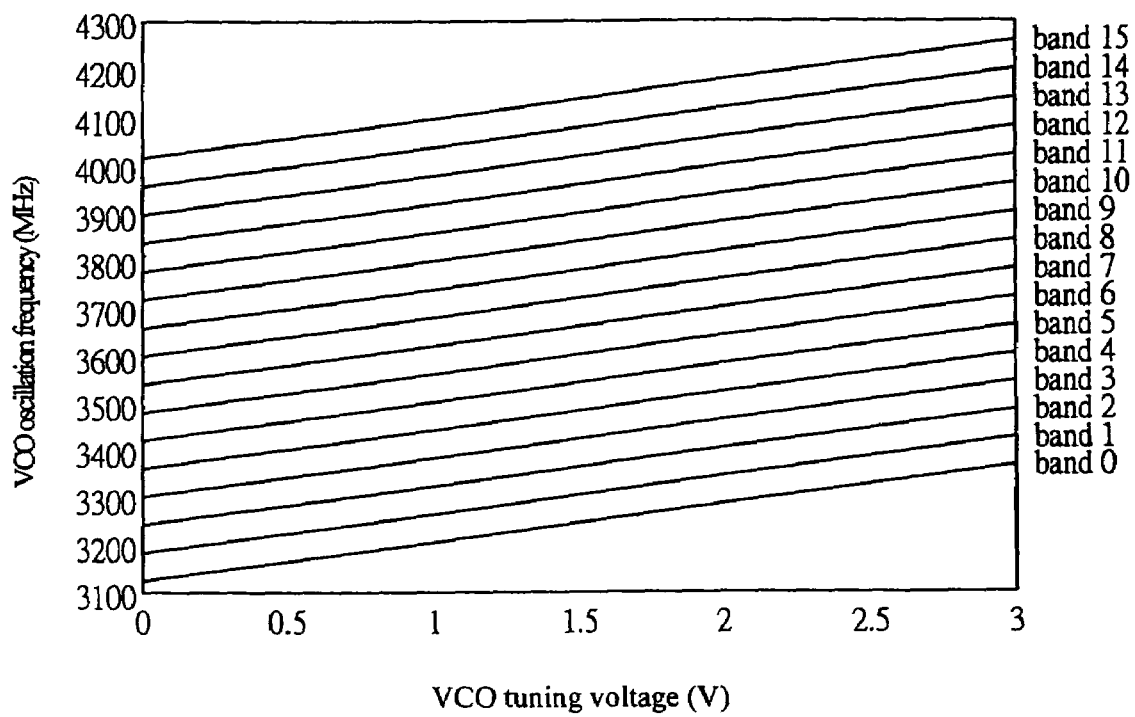
FIG. 1 is an explanatory diagram showing the characteristic of the VCO oscillation frequency vs the VCO tuning voltage of a VCO having multiple oscillation bands, in a method of minimizing the influence which the fluctuation of the VCO oscillation frequency due to temperature change exerts on the time of an automatic band selection according to an embodiment of the present invention.
Figure 2:
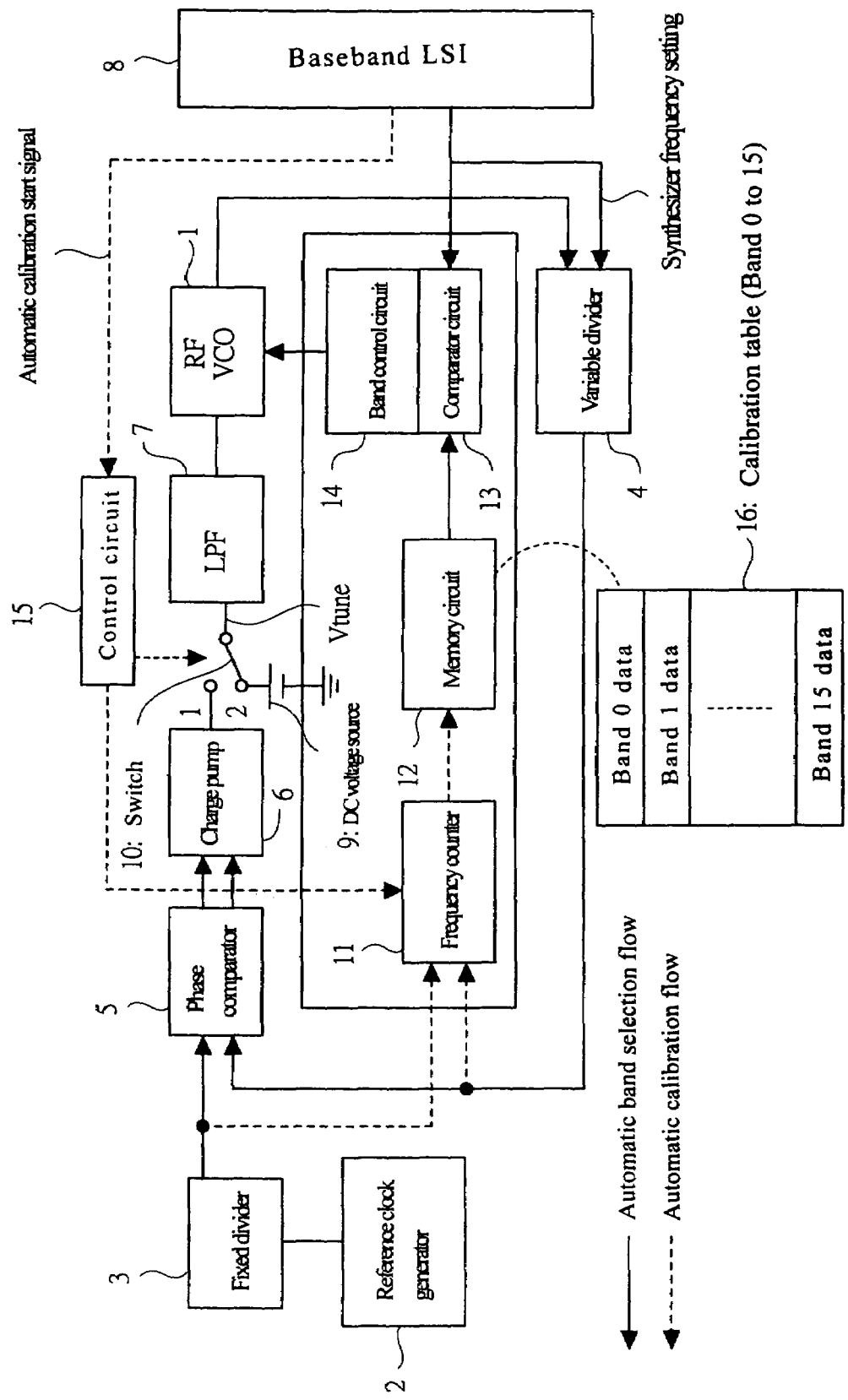
FIG. 2 is a block diagram of the PLL circuit using a VCO having multiple oscillation bands, in a method of minimizing the influence that the fluctuation of the VCO oscillation frequency due to temperature change exerts on the time of an automatic band selection according to an embodiment of the present invention.
Figure 3:
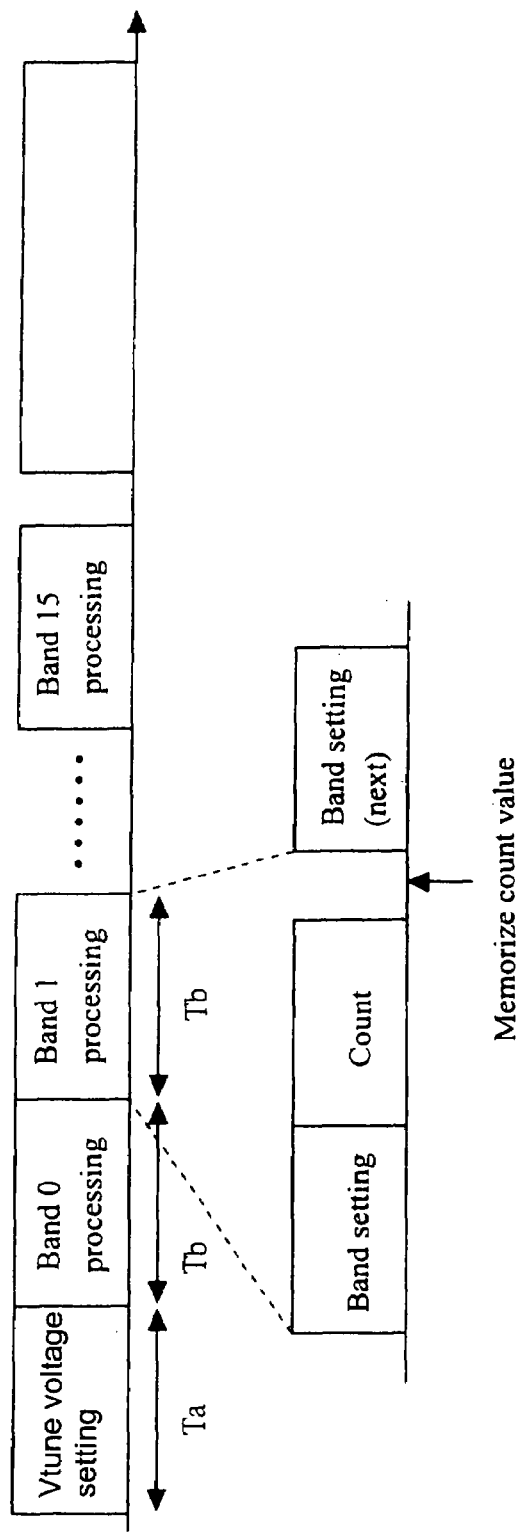
FIG. 3 is a timing diagram showing an automatic calibration, in a method of minimizing the influence that the fluctuation of the VCO oscillation frequency due to temperature change exerts on the time of an automatic band selection according to an embodiment of the present invention.
Figure 4:
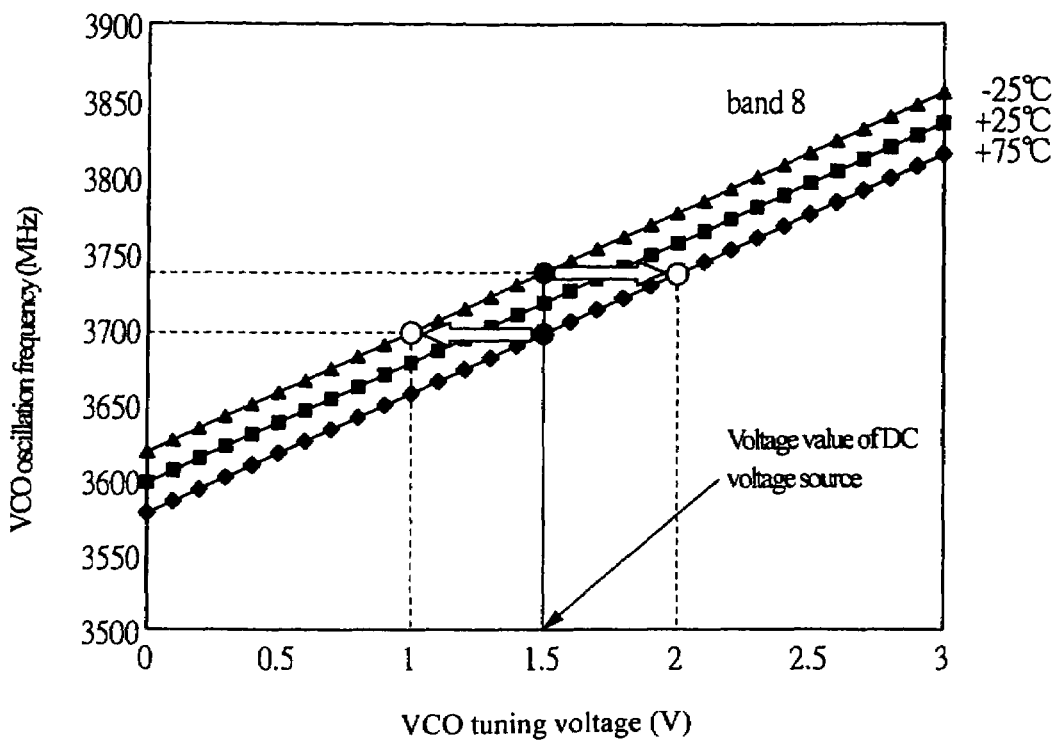
FIG. 4 is an explanatory diagram showing the change in the characteristic of the VCO oscillation frequency vs the VCO tuning voltage relative to temperature, in a method of minimizing the influence which the fluctuation of the VCO oscillation frequency due to temperature change exerts on the time of an automatic band selection according to an embodiment of the present invention.

Descriptions will be made of the method of minimizing the influence that the fluctuation of the VCO oscillation frequency due to temperature change exerts on the time of the automatic band selection, with reference to FIGS. 1 to 6. FIG. 1 is an explanatory diagram showing the characteristic of the VCO oscillation frequency vs the VCO tuning voltage relative to a VCO having multiple oscillation bands. FIG. 2 is a block diagram of the PLL circuit using the VCO having multiple oscillation bands. FIG. 3 is a timing diagram of the automatic calibration. FIG. 4 is an explanatory diagram showing the change in the characteristic of the VCO oscillation frequency vs the VCO tuning voltage due to temperature. FIG. 5 is an explanatory diagram showing the change in characteristic of the VCO oscillation frequency vs the VCO tuning voltage due to temperature and showing the temperature change of a DC voltage source. FIG. 6 is a block diagram of a voltage circuit having a positive temperature characteristic.

Although not particularly limited, the PLL circuit in this embodiment is a PLL circuit for controlling an RFVCO having the characteristic of the VCO oscillation frequency vs the VCO tuning voltage, for example, the characteristic which has a band of 3700 MHz and in which the band switching in 16 bands of bands 0 to 15 is used as shown in FIG. 1. Therefore, the RFVCO can cover the whole frequency range, and, meanwhile, each of the bands can cover only its small part.

For example, the PLL circuit according to the present embodiment comprises, as shown in FIG. 2, an RFVCO 1; a reference clock generator 2 for oscillating a frequency with great accuracy by using a crystal oscillator; a fixed divider 3 for dividing the reference oscillation signal of the reference clock generator 2; a variable divider 4 for dividing an oscillation signal of the RFVCO 1; and a phase comparator 5, a charge pump 6, an LPF 7, and the like for comparing the respective phases of the signals divided by the fixed divider 3 and the variable divider 4 and for outputting an increased or decreased voltage corresponding to the phase difference. A capacitor element of the LPF 7 is charged up by the charge pump 6 and outputted as a tuning voltage Vtune, and thus the PLL loop is constituted.

The RFVCO 1 is constituted by, for example, a Colpitts oscillator circuit using an LC resonator circuit. Further, the REVCO 1 is constituted such that a plurality of capacitor elements constituting an LC resonator circuit are provided in parallel to each other via respective switching elements, and the switching elements can be selectively turned on by switching the connected capacitor elements, that is, by the value of the C of the LC resonator circuit. Meanwhile, the RFVCO 1 has a varicap diode as a variable capacitor element, such that the capacitance of this varicap diode is changed by the tuning voltage Vtune from the LPF 7 and the oscillation frequency is changed successively.

The variable divider 4 can divide the oscillation signal of the RFVCO 1 into, for example, 1/N at the optional division ratio corresponding to the synthesizer frequency setting value set by an outer baseband LSI 8. The oscillation frequency of the RFVOC 1 is controlled so that the frequency of the signal divided by the variable divider 4 and the frequency of the reference oscillation signal of the reference clock generator 2 divided into, for example, 1/R by the fixed divider 3 can correspond to each other.

The PLL circuit in this embodiment is provided with a switch 10 located between the charge pump 6 and the LPF 7 and capable of supplying a predetermined DC voltage to the LPF 7 from the DC voltage source 9 instead of a voltage from the charge pump 6; a frequency counter 11 for counting the oscillation signals of the RFVCO 1; a memory circuit 12 including a table or the like for memorizing the value counted by this frequency counter 11; a comparator circuit 13 for comparing the frequency value memorized in this memorizing circuit 12 and the setting value set in the variable divider 4 from the baseband LSI 8; a band control circuit 14 for controlling the switching of the bands of the RFVCO 1 based on the comparison result by this comparator circuit 13; a control circuit 15 for controlling the switch 10, the frequency counter 11, and the like according to the commands such as an automatic calibration start signal or the like sent from the baseband LSI 8; and the like.

In this PLL circuit, the counter value of each oscillation band counted by the frequency counter 11 is memorized in the calibration table 16 of the memory circuit 12 at the time of the automatic calibration. Also, the DC voltage of the DC voltage source 9 can take any voltage value if being within an effective variable range of the tuning voltage Vtune. Generally, an upper limit value or a lower limit value within the variable range of the tuning voltage Vtune is selected. Especially, in order to correspond to the change in temperature in the characteristic of the VCO oscillation frequency vs the VCO tuning voltage, the circuit configuration of this DC voltage source 9 has such a dependent property that the frequency thereof changes depending on temperature change. Detail descriptions thereof will be made later.

In this embodiment, if it is required to expand the frequency range to be covered, the RFVCO 1 is constituted such that a plurality of capacitor elements constituting the LC resonator circuit are provided in parallel, and the capacitor element used by the band switching signal is switched in n steps to change the value of the C, and thereby the oscillation control in accordance with a plurality of characteristic lines of the VCO oscillation frequency vs the VCO tuning voltage can be performed. Furthermore, in this embodiment, since the frequency counter 11, the memory circuit 12, the comparator 13, and the band control circuit 14 are provided, adjustment work for frequency matching is not required.

More specifically, in the case of constituting the RFVCO 1 having multiple oscillation bands as shown in FIG. 1, the switch 10 is previously switched to apply, to the RFVCO 1, a predetermined DC voltage from the DC voltage source 9, and the frequency at each band is measured by the frequency counter 11 and memorized in the memory circuit 12. At the time of actual use, a setting value corresponding to a specified band of the synthesizer frequency given to the variable divider 4 from the baseband LSI 8 is compared with the measured value memorized in the memory circuit 12, and the one capable of covering the frequency range of the specified band is selected from a plurality of the characteristic lines of the VCO oscillation frequency vs the VCO tuning voltage, and then the RFVCO 1 is switched (switching of the capacitor element) so as to perform the oscillation control operation in accordance with a selected characteristic line.

According to such a method, if the RFVCO 1 is designed so that a little wider range up to such a degree as to consider the irregularity thereof than the frequency range to be covered in advance is covered and also if the RFVCO 1 is designed so that the respective frequency ranges of adjacent ones among the characteristic lines of the VCO oscillation frequency vs the VCO tuning voltage having the n steps as shown in FIG. 1 are overlapped partly (desirably, by halves), then the characteristic line capable of covering the specified range exists surely. Therefore, since the one corresponding to each specified band may be selected based on the actual characteristic obtained by the measurement, the matching of the frequency becomes unnecessary and thereby the band to be used and the switched state of the RFVCO 1 may be corresponded one by one in advance.

Moreover, in this embodiment, when the oscillation frequency of the RFVCO 1 is measured, the start and finish of the counting operation of the frequency counter 11 are controlled by the signal dividing the reference oscillation signal and the frequency counter 11 is made to operate for only one cycle and thereby the troublesome arithmetic processing is not required. More specifically, in the case where the variable divider 4 for dividing the oscillation signal of the RFVCO 1 is provided, if the counter value of the frequency counter 11 corresponding to the oscillation signal for one cycle in each band is memorized, then it is possible to determine on the basis of which one of the characteristic lines of the VCO oscillation frequency vs the VCO tuning voltage the RFVCO 1 should be made operate, only by comparing these counter values and the setting value supplied to the variable divider 4 from the outside.

In the PLL circuit having the configuration as described above, the automatic calibration switches, as shown in the timing diagram of FIG. 3, the switch 10 to a side 2 (to a side of the DC voltage source 9) by the control circuit 15 at the time of the switch-on, and thereby the tuning voltage Vtune of the RFVCO 1 is fixed to the voltage value of the DC voltage source 9. Thereafter, in the processes of each of the bands 0 to 15, the oscillation bands are set by turns to count the frequency thereof by the frequency counter 11, and the counter values are memorized as the calibration table 16 in the memory circuit 12. After the automatic calibration, the normal operation of the synthesizer is started.

Also, the automatic band selection switches the switch 10 to a side 1 (to a side of the LPF 7), and thereby the frequency setting value from the baseband LSI 8 and the counter value memorized in the calibration table 16 of the memory circuit 12 are compared and an optimum band is selected.

Next, the method of minimizing the influence exerted by the fluctuation of the VCO oscillation frequency due to temperature change at the time of the automatic band selection will be described concretely. In the case of performing the automatic calibration, the tuning voltage Vtune of the RFVCO 1 is fixed to the voltage value of the DC voltage source 9. In this embodiment, however, since the temperature characteristic for canceling the VCO oscillation frequency is given to the DC voltage source 9 (expression (1)), the influence on the band selection can be minimized at the time when the calibration table 16 comes to no optimum one.

$$\Delta fVCO/\Delta T = -2KVCO(\Delta VB/\Delta T) \qquad (1),$$

where $\Delta fVCO$, $KVCO$, $\Delta VB$, and $\Delta T$ are defined as the change in the oscillation frequency of the RFVCO 1, the sensitivity of the oscillation frequency vs the tuning voltage of the RFVCO 1, the change in the DC voltage of the DC voltage source 9, and the temperature change, respectively.

For example, if the voltage value of the DC voltage source is constant (e.g., 1.5V) and has no temperature dependence like the PLL circuit according to the premise technique of the present invention, then when the temperature at the time of the switch-on is −25° C. as shown in FIG. 4, 3750 MHz is counted and memorized as the calibration table 16 of the band 8. Thereafter, when the temperature rises to +75° C., 3750 MHz is equivalent to the tuning voltage Vtune of 2V. This produces the same result as the case where the voltage value of the DC voltage source is 2V on such the environment that the temperature at the time of the switch-on is +75° C.

Similarly, such the environment that the temperature at the time of the switch-on is +75° C. and thereafter the temperature falls to −25° C. is equal to the case where the temperature at the time of the switch-on is −25° C. and where the voltage value of the DC voltage source is 1V. More specifically, this corresponds a 1V fluctuation of the DC voltage source equivalently from 1V to 2V due to temperature change. In the constitution of the PLL circuit according to the premise technique of the present invention, the tuning voltage Vtune at the time of the normal operation operates by using the voltage value of the DC voltage source as a base point. Therefore, that the DC voltage source fluctuates large means that the base point of the tuning voltage Vtune at the time of the normal operation fluctuates large.

Contrary to this, if a temperature characteristic is thought to be given to the voltage value of the DC voltage source 9 like the PLL circuit of the present invention, as shown in FIG. 5, in the case where the temperature at the time of the switch-on is −25° C. and where the VCO tuning voltage is 1.25V at the time of this, 3725 MHz is counted and memorized as the calibration table 16 of the band 8. If the temperature rises to +75° C., the 3725 MHz corresponds to the tuning voltage Vtune of 1.75V. This means the environment in which the temperature at the time of the switch-on is +75° C., and results in the same as the case where the voltage value of the DC voltage source 9 is 1.75V.

Similarly, such an environment that the temperature at the time of the switch-on is +75° C. and the VCO tuning voltage is 1.75V at the time of this and thereby the temperature falls to −25° C. is equal to the case where the temperature at the time of the switch-on is −25° C. and where the voltage value of the DC voltage source 9 is 1.25V. More specifically, this corresponds to a 0.5V fluctuation of the DC voltage source 9 from 1.25V to 1.75V due to the temperature change. This shows that the fluctuation in the base point of the tuning voltage Vtune becomes smaller in comparison to the case where the DC voltage source has no temperature characteristic. In this case, $\Delta fVCO$, $KVCO$, $\Delta VB$, and $\Delta T$ are −50

MHz, 50 MHz/V, 0.5V, and 100 deg, respectively, each of which satisfies the expression (1).

For example, FIG. 6 shows an example of a circuit configuration of the DC voltage source 9 having a positive temperature characteristic. The circuit is constituted by a transistor T, MOSFETs M2 and M3, resistors R2 and R3, and the like. In this voltage circuit, if the base-emitter voltage of the transistor T is set to VBE, then V2 can be obtained by the expression (2).

$$V2 = V1 - VBE \quad (2)$$

Therefore, a current I2 passing through the resistor R2 can be obtained by the expression (3)

$$I2 = V2/R2 = (V1 - VBE)/R2 \quad (3)$$

Assuming that a current mirror circuit composed of the MOSFETs M2 and M3 returns the current at a ratio of 1 to 1, then I3=I2 can be obtained and V3 can be obtained by the expression (4).

$$V3 = R3 \cdot I3 = R3 \cdot I2 = R3(V1 - VBE)/R2 \quad (4)$$

When the expression (4) is differentiated with the temperature, the expression (5) can be obtained.

$$dV3/dT = d[R3(V1 - VBE)/R2]/dT \quad (5),$$

where assuming that the temperature dependence of the output V1 and the resistors R2 and R3 in a bandgap reference circuit is 0, the expression (6) can be obtained.

$$dV3/dT = -d(R3/R2) \times dVBE/dT \quad (6)$$

Since VBE usually has a negative temperature characteristic, dVBE/dT becomes negative and V3 has a positive temperature characteristic. The circuit configuration like this makes it possible to give the temperature characteristic to the voltage value of the DC voltage source 9.

1-2. Method of Performing Recalibration

With reference to FIGS. 7 to 9, the method of performing the recalibration will be described. FIG. 7 is a timing diagram of the recalibration. FIG. 8 is a timing diagram of the GSM. FIG. 9 is an explanatory diagram showing the number of the recalibrations and that of the TDMA frames (in the case of the oscillation bands 16), respectively.

The fluctuation of the VCO oscillation frequency due to the temperature change is recalibrated and reflected to the calibration table 16, and thereby the optimum band selection can be executed at any time. However, because of the development of high-speed information communication by mobile phones, it is impossible to take the time for recalibrating all of the bands except the time of the switch-on. Accordingly, only one band (or the number of bands allowed in time by the system) is recalibrated during the normal operation of the mobile phone. There are two methods available to this recalibration.

(1) In the case where the frequency of the PLL circuit is set, the band of the VCO oscillation frequency is selected based on the previous calibration table 16. The recalibration is performed relative to only this selected band. The configuration of the PLL circuit used in this method is the same as that of the PLL circuit shown in FIG. 2. The timing diagram in this case is shown in FIG. 7. In the aforementioned calibration at the time of the switch-on shown in FIG. 3, the counting operations are performed relative to all of the bands and the total time is Ta+16×Tb. Meanwhile, in this case shown in FIG. 7, a counting operation is performed relative to only one band and the total time is Ta+Tb. After the counting, the error of the previous calibration table 16 is calculated and the calculated error is added to the calibration tables 16 of all bands.

More specifically, a method is used in which on the basis of the fact that an actually counter value is measured about one band but the change of one band is equal to those of the other bands, the counter value memorized about the selected band is updated and simultaneously the counter value is estimated also about the rest of the bands to update the calibration tables 16.

In this method, in the timing diagram of the GSM as shown in FIG. 8, the recalibration is performed after a monitor having been performed once relative to one frame. In the GSM, the period of time is divided into a series of short period called time slot in the TDD (Time Division Duplexing). The slots are combined and grouped into a frame, a super frame, or a hyper frame. A base station requires a function of transmission and reception simultaneously. However, the mobile phone does not perform simultaneous transmission and reception.

(2) The recalibration of each oscillation band is performed by turns per slot of the time division of the mobile phone regardless of the setting value of the frequency of the PLL circuit, and the aforementioned sequence is repeated to rewrite the calibration tables 16 sequentially. Accordingly, as shown in FIG. 9, the number of the slots corresponding to that of the oscillation bands are required to perform the recalibration of all the bands.

2. Inhibition of the Increase in the Chip Area

The PLL circuit is used to switch the band such that the VCO having multiple oscillation bands corresponds to the setting frequency. Therefore, it is necessary to provide the calibration table, which results in the increase of an occupied area. Meanwhile, in the case where the frequency variable range is narrow and the switching of the band is unnecessary once the optimum band is selected, reduction in the occupied area is desired by using the following methods: 2-1. a method of calculating the error of the target frequency, 2-2. a method of comparing the target frequency in level, 2-3. a method of measuring a VCO tuning voltage, and 2-4. a method of measuring another VCO tuning voltage.

2-1. A Method of Calculating the Error of the Target Frequency

With reference to FIGS. 10 to 12, the method of calculating the error of the target frequency will be described. FIG. 10 is an explanatory diagram of an error of the target frequency in the characteristic of the VCO oscillation frequency vs the VCO tuning voltage. FIG. 11 is a block diagram of a PLL circuit using an IFVCO in order to explain the automatic calibration. FIG. 12 is a flow chart of the calibration of an IFVCO.

Although not particularly limited, the PLL circuit in this embodiment is a PLL circuit using, for example, eight band switches of the bands 0 to 7 and controlling an IFVCO having the characteristic of the VCO oscillation frequency vs the VCO tuning voltage, wherein a target frequency has 320 MHz in the IF (Intermediate Frequency) band and a variable range is ±4 MHz as shown in FIG. 10.

For example, in the case where the VCO tuning voltage is set to the voltage value of the DC voltage source, the errors between the target frequency of 320 MHz and each VCO oscillation frequency of the bands 0 to 7 are measured and the band having the smallest error of the errors can be selected as the optimum oscillation frequency band. In FIG. 10, the band 3 is the optimum band. Detail descriptions thereof will be made later.

Although the PLL circuit in this embodiment has the same configuration as that shown in FIG. 2, the PLL circuit in this embodiment also has a configuration as shown in FIG. 11 in order to be applied to an intermediate frequency band. More specifically, the PLL circuit is constituted such that the RFVCO 1 is replaced with an IFVCO 1a, and a target frequency of a memory circuit 12a is inputted to one of the inputs of a comparator 13a as a fixed value, and a counter value of a frequency counter 11a is inputted to the other of the inputs of the comparator 13a. FIG. 11 is shown in which "a" is added to each of reference symbols (numerals) of components corresponding to the components shown in FIG. 2 and each component of the PLL circuit has the same function. Therefore, detailed descriptions thereof will be omitted here.

In the PLL circuit constituted as described above, the automatic calibration of the IFVCO 1a is performed according to the process shown in FIG. 12.

(1) The VCO tuning voltage Vtune is set to an optional value (Step S1). This value is not changed during the automatic calibration. This VCO tuning voltage Vtune serves as, for example, a voltage value of the DC voltage source 9a in the configuration shown in FIG. 11. This voltage value of the DC voltage source 9a is set by a control circuit 15a which switches a switch 10a to a side 2 (to a side of the DC voltage source 9a) based on the commands sent from the baseband LSI 8 and starting the automatic calibration.

(2) The initial value of an oscillation frequency band is set to the band 0 and a memorized value ER of an error resistor is set to the maximum value (Step S2). This setting of the oscillation frequency band is performed by a band control circuit 14a. Also, the error resistor is provided in, for example, the comparator circuit 13a and is finally updated from the maximum value to the value having the smallest error.

(3) The oscillation frequency of the IFVCO 1a is measured (Step S3). The number of pulses from the IFVCO 1a during a comparison cycle of the PLL circuit is counted as a means for measuring this frequency. The counting of this pulse number is performed by the frequency counter 11a.

(4) The error between the counter value and the target value is calculated (Step S4). This calculation of the error is performed in the comparator circuit 13a based on the counter value from the frequency counter 11a and the target value of the target frequency memorized in the memory circuit 12a, and the absolute value of the difference therebetween is set as the error.

(5) The error obtained by the calculation is compared with the memorized value ER of the error resistor. If the calculated error is smaller than the memorized value ER, the memorized value ER of the error resistor is updated with the value (Steps S5 and S6). The comparison between the error and the memorized value ER is performed in the comparator circuit 13a. Meanwhile, if the error is larger than the memorized value ER, this process proceeds to the step of determining whether or not processes for all bands are finished.

(6) It is determined whether or not processes for all bands are finished. Then, each one upper band is sequentially selected until processes for all bands are finished. The operation from the counting to the updating of the memorized value ER is repeatedly performed relative to all bands (Steps S7 and S8).

(7) After processes for all bands are finished, the band that has calculated the memorized value ER of the error resistor left at the end of the step is selected (Step S9). By doing so, it is possible to select the band having the smallest error between the target frequency and the VCO oscillation frequency of each band, as the optimum oscillation frequency band.

2-2. A Method of Comparing the Target Frequency in Level

With reference to FIGS. 13 to 23, a method of comparing the target frequency in level will be described. FIG. 13 is an explanatory diagram of the level comparison of the target frequency in the characteristic of the VCO oscillation frequency vs the VCO tuning voltage. FIG. 14 is a block diagram of a calibration circuit block. FIG. 15 is a block diagram of the case where a voltage source is used. FIG. 16 is a block diagram of the case where a current source is used. FIG. 17 is a flow chart of an automatic calibration. FIG. 18 is a flow chart of another automatic calibration. FIG. 19 is an explanatory diagram showing the level comparison of another target frequency in the characteristic of the VCO oscillation frequency vs the VCO tuning voltage. FIG. 20, FIG. 21, FIG. 22 and FIG. 23 are flow charts of still another automatic calibration, respectively.

As shown in FIG. 13, on the assumption that the IFVCO 1a has a negative characteristic of the VCO oscillation frequency vs the VCO tuning voltage, when the calibration voltage is set to a higher permissible value of the IFVCO 1a, the target frequency and the VCO oscillation frequency of each band are compared with each other in level and the smallest band is selected as the optimum oscillation frequency band. In this case, the comparison of the upper three bands of the four bands 0 to 3, that is, a band 3 (C3), a band 2 (C2) and a band 1 (C1), is made in level.

The same circuit configuration as the circuit configuration shown in FIG. 11 can be used as the PLL circuit for realizing a method of making the level comparison of this target frequency. Note that the calibration circuit block is constituted such that, as shown in, for example, FIG. 14, 13 MHz/26 MHz is generated by a reference clock generator 2a, and is counted in a reference counter 21 of the fixed divider 3a, and thereafter is divided into one-fourth by the calibration sequencer, and is supplied to the frequency counter 11a as a gate signal. Meanwhile, the tuning voltage Vtune from the IFVCO 1a is divided into one-sixteenth by a prescaler 23 of the variable divider 4a, and is supplied to a frequency counter 11a, and then counts the number of pulses of this oscillation frequency in one cycle of the gate signal.

Also, as shown in, for example, FIG. 15, in the DC voltage source 9a, a voltage source such as an electric battery 24 is connected to the LPF 7a of the PLL circuit to set the fixed voltage. Alternatively, as shown in, for example, FIG. 16, it is also possible to use a current source 25 for feeding a current to an LPF 7a for a predetermined time until a desired calibration voltage is obtained.

In this calibration circuit block having such a configuration, the automatic calibration is performed according to the process shown in FIG. 17.

(1) The VCO tuning voltage Vtune is set at an optional value (over the operation voltage). This value is not changed during the automatic calibration. At this time, the target value X of the target frequency is also set (Step S11).

(2) The initial value of the oscillation frequency band is set at the highest band 3 and the oscillation frequency of the IFVCO 1a is measured (Step S12). As a measuring means of this frequency, the number of pulses from the IFVCO 1a during a comparison cycle of the PLL circuit is counted by the frequency counter 11a. This counter value of the band 3 is set as C3.

(3) The counter value C3 and the target value X are compared to each other. If the counter value C3 is smaller (including the case where both are equal), the band 3 is selected and the automatic calibration is finished (Steps S13 and S14). Meanwhile, if the counter value C3 is larger, the process proceeds to the next step.

(4) Similarly, the oscillation frequency band is decremented in order of the second-highest band 2 and further the third-highest band 1 sequentially, and then the setting of each band, the measurement of the oscillation frequency of the IFVCO 1a, and the comparison of the counter value and the target value are performed, respectively. If the counter value C2 is smaller than the target value X, the band 2 is selected and the automatic calibration is finished. If the counter value C1 is smaller than the target value X, the band 1 is selected and the automatic calibration is finished (Steps S15 to S20).

(5) As a result of the comparison of the counter value C1 and the target value X, if the counter value C1 is larger, the lowest band 0 is selected and the automatic calibration is finished (Step S21). By doing so, it is possible to select the band that is nearest to the target value X, as the optimum oscillation frequency band.

In FIG. 17, the description of the case where the initial value of the oscillation frequency band is set at the highest band 3 has been made. However, for example, it is also possible to set the initial value at the lowest band. The automatic calibration in this case is performed, for example, according to the process shown in FIG. 18.

(1) After the target value X of the target frequency is set, the oscillation frequency band is set at the lowest band 1 and the measurement of the oscillation frequency and the comparison of the counter value and the target value are performed, respectively. If the counter value C1 is larger than the target value X, the band 0 is selected and the automatic calibration is finished (Steps S31 to S34). Meanwhile, if the counter value C1 is smaller, the process proceeds to the next step.

(2) Similarly, the oscillation frequency band is incremented in order of the second-lowest band 2 and further the third-lowest band 3 sequentially, and then the setting of each band, the measurement of the oscillation frequency of the IFVCO, and the comparison of the counter value and the target value are performed, respectively. If the counter value C2 is larger than the target value X, the band 1 is selected. If the counter value C3 is larger than the target value X, the band 2 is selected and the automatic calibration is finished (Steps S35 to S40).

(3) As a result of the comparison of the counter value C3 and the target value X, if the counter value C3 is smaller, the highest band 3 is selected and the automatic calibration is finished (Step S41). By doing so, it is possible to select the band that is nearest to the target value X, as the optimum oscillation frequency band.

In the foregoing, the description of the case where the calibration voltage is set at the higher permissible value of the IFVCO 1a has been made. However, for example, it is also possible to set the calibration voltage at the lower values. In this case, as shown in, for example, FIG. 19, the calibration voltage is set at the lower permissible value of the IFVCO 1a, and the target frequency and the VCO oscillation frequency of each band are compared to each other with regard to the lower three bands of the four bands 0 to 3, that is, with regard to the band 0 (C0), the band 1 (C1) and the band 2 (C2). Also in this case, there are two cases that the initial value of the oscillation frequency band is set at the highest band 2 (FIG. 20) and that the initial value of the oscillation frequency band is set at the lowest band 0 (FIG. 21).

In the case where the initial value of the oscillation frequency band is set at the highest band 2 as shown in FIG. 20, in accordance with the steps S51 to S61, after the target value X of the target frequency is set, the oscillation frequency band is decremented in order of the highest band 2, the second-highest band 1 and the third-highest band 0 sequentially, and then the setting of each band, the measurement of the oscillation frequency of the IFVCO 1a, and the comparison of the counter value and the target value are performed, respectively. If the counter value C2 is smaller than the target value X (including the case where both are equal), the band 3 is selected and the automatic calibration is finished. If the counter value C1 is smaller, the band 2 is selected and the automatic calibration is finished. If the counter value C0 is smaller, the band 1 is selected and the automatic calibration is finished. Meanwhile, if the counter value C1 is larger than the target value X, the lowest band 0 is selected and the automatic calibration is finished. By doing so, it is possible to select the band that is nearest to the target value X, as the optimum oscillation frequency band.

In the case where the initial value of the oscillation frequency band is set at the lowest band 0 as shown in FIG. 21, in accordance with the steps S71 to S81, after the target value X of the target frequency is set, the oscillation frequency band is incremented in order of the lowest band 0, the second-lowest band 1 and the third-lowest band 2 sequentially, and then the setting of each band, the measurement of the oscillation frequency of the IFVCO 1a, and the comparison of the counter value and the target value are performed, respectively. If the counter value C0 is larger than the target value X, the band 0 is selected and the automatic calibration is finished. If the counter value C1 is larger, the band 1 is selected and the automatic calibration is finished. If the counter value C2 is larger, the band 2 is selected and the automatic calibration is finished. Meanwhile, the counter value C2 is smaller than the target value X, the highest band 3 is selected and the automatic calibration is finished. By doing so, it is possible to select the band that is nearest to the target value X, as the optimum oscillation frequency band.

Furthermore, some methods of comparing a target frequency in level are methods of making the level comparison in parallel as shown in FIG. 22 (corresponding to the characteristic of the VCO oscillation frequency vs the VCO tuning voltage in FIG. 13) and FIG. 23 (corresponding to the characteristic of the VCO oscillation frequency vs the VCO tuning voltage in FIG. 19).

In the case as shown in FIG. 22, after the target value X of the target frequency is set, the oscillation frequency band is set at the band 2, the oscillation frequency of the IFVCO 1a is measured to compare the counter value and the target value with each other. If the counter value C2 is smaller than the target value X (including the case where both are equal), the process proceeds to the step of the band 3. Meanwhile, if the counter value C2 is larger, the process proceeds to the step of the band 1 (Steps S91 to S93).

In the step of the band 3, similarly, the oscillation frequency band is set at the band 3, and the measurement of the oscillation frequency of the IFVCO 1a and the comparison of the counter value and the target value are performed, respectively. If the counter value C3 is smaller than the target value X, the band 3 is selected. Meanwhile, if the counter value C3 is larger, the band 2 is selected (Steps S94 to S97).

Also in the step of the band 1, similarly, the oscillation frequency band is set at the band 1, and the measurement of oscillation frequency of the IFVCO 1a and the comparison of the counter value and the target value are performed, respectively. If the counter value C1 is smaller than the target value X, the band 1 is selected. Meanwhile, when the counter value C1 is larger, the band 0 is selected (Steps S98 to S101).

In the case as shown in FIG. 23, in accordance with the steps S111 to S113, after the target value X of the target frequency is set, the oscillation frequency band is set at the band 1 and the oscillation frequency of the IFVCO 1a is measured and then the counter value and the target value are compared with each other. If the counter value C1 is smaller than the target value X (including the case where both are equal), the process proceeds to the step of the band 2. Meanwhile, if the counter value C1 is larger, the process proceeds to the step of the band 0. Also in the steps of the band 2 and the band 0, similarly, in accordance with the steps of S114 to S121, the setting of the band, the measurement of the oscillation frequency of the IFVCO 1a, and the comparison of the counter value and the target value are performed, respectively. If the counter value C2 is smaller than the target value X, the band 3 is selected. If the counter value C2 is larger, the band 2 is selected. If the counter value C0 is smaller, the band 1 is selected. Further, if the counter value C0 is larger, the band 0 is selected.

2-3. A Method of Measuring a VCO Tuning Voltage

With reference to FIGS. 24 to 26, the description of a method of measuring a VCO tuning voltage will be made. FIG. 24 is a block diagram of a calibration circuit block. FIG. 25 is a timing diagram of an automatic calibration. FIG. 26 is a timing diagram of another automatic calibration.

As shown in FIG. 24, the calibration circuit block is constituted such that a plurality of capacitor elements 31 each constituting an LC resonator circuit is provided in parallel via respective switching elements 32 and the switching elements 32 are selectively switched on by the band switching signal and the LC resonator connected thereto, that is, the value of the C of each capacitor element 31 is changed and thereby the IFVCO 1a can gradually change the oscillation frequency. Meanwhile, the IFVCO 1 has a varicap diode as a variable capacitor element 33, and the capacitance of this varicap diode is changed by the tuning voltage from the LPF 7a, and thereby the oscillation frequency is changed successively.

The measured value obtained by measuring the tuning voltage of the IFVCO 1a and the threshold value serving as a judgment criterion of the automatic calibration are inputted into a comparator 34. In the comparator 34, the measured value and the threshold value are compared and judged, and the band that is nearest to the threshold value is selected as the optimum oscillation frequency band within a necessary range of the oscillation frequency of the IFVCO 1a. This comparator 34 is connected to a side 1 of the switch 10a between the LPF 7a and the charge pump 6a. Also, the target frequency is supplied via A/N counters 35 and a prescaler 36 of the variable divider 4.

In the calibration block having the configuration as described above, the automatic calibration is performed in accordance with the process shown below.

(1) The VCO tuning voltage is oscillated at the target frequency. At this time, the switch 10a is set so as not to cut the loop of the PLL circuit. More specifically, the switch 10a is connected to the side 1, and thereby such a loop as to pass the IFVCO 1a, the variable divider 4a, a phase comparator 5a, the charge pump 6a and the LPF 7a comes to a closed state.

(2) The initial value of the oscillation frequency band is set to the lowest band and the IFVCO 1a is made to oscillate at the target frequency under the control of the PLL circuit. The setting of this band is made by the band control circuit 14a.

(3) The tuning voltage of the IFVCO 1a is measured, and the measured value and the threshold value are compared. If the measured value is larger, this band is selected and the automatic calibration is finished. This comparison of the measured value and the threshold value is made by the comparator 34 connected between the LPF 7a and the charge pump 6a.

(4) In the above-described step (3), the band is incremented sequentially and the steps (1) to (3) are repeated until the automatic calibration is finished.

For example, in FIG. 25, the threshold value is set at a value higher than the band 2 and lower than the band 3 among the bands 0 to 3. In this case, even if the bands 0, 1 and 2 are set, the comparison result between the measured value obtained by making the IFVCO 1a oscillate and the threshold value shows that both of the measured values are not larger than the threshold value. Therefore, the process proceeds to the setting of the next band that covers the higher frequency. Then, when the band 3 is set, the comparison result between the measured value and the threshold value shows that the measured value is larger than the threshold value. Therefore, this band 3 is selected and the automatic calibration is finished.

In FIG. 25, the case where the initial value of the oscillation frequency band is set at the lowest band has been described. However, it is also possible to set the initial value at the highest band. The automatic calibration in this case proceeds, for example, as shown in FIG. 26.

As shown in FIG. 26, in the case where the threshold value is set at a value lower than the band 5 and higher than the band 4 among the bands 7 to 4, even if the bands 7, 6 and 5 are set, the comparison result between the measured value obtained by making the IFVCO 1a oscillate and the threshold value shows that any of the measured values are not smaller than the threshold value. Therefore, the process proceeds to the setting of the next band that covers the lower frequency. Then, when the band 4 is set, the comparison result between the measured value and the threshold value shows that the measured value is smaller than the threshold value and so the band 4 is selected and the automatic calibration is finished.

2-4. A Method of Measuring Another VCO Tuning Voltage

With reference to FIGS. 27 and 28, the description of a method of measuring another VCO tuning voltage will be made. FIG. 27 is a block diagram of a calibration circuit block. FIG. 28 is a timing diagram of an automatic calibration.

As shown in FIG. 27, in the circuit configuration of the calibration block, relative to the circuit configuration shown in FIG. 24 described above, the threshold value serving as the judgment criteria of the automatic calibration is set at two threshold values of the upper threshold value and the lower threshold value, and the measured value obtained by measuring the tuning voltage of the IFVCO 1a and the upper threshold value are compared and judged in one comparator 37, and the measured value and the lower threshold value are compared and judged in the other comparator 38, and then the band being within the range of the two threshold values is selected as the optimum oscillation frequency band via an AND gate.

Also, in this method, the decision speed of the PLL circuit can be made to speed up, by setting a constant intermediate voltage (0.5×Vcc) in the LPF 7a of the PLL circuit prior to the measurement thereof. More specifically, since the intermediate voltage is set at the VCO tuning voltage and the two comparators 37 and 38 are used, it is possible to determine whether the band number of the IFVCO 1a should be incremented or decremented. When the VCO tuning voltage is too low, the band number is incremented and when the VCO tuning voltage is too high, the band number is decremented.

In the calibration circuit block having the configuration as described above, the automatic calibration is performed as follows.

(1) The VCO tuning voltage is made to oscillate at the target frequency. At this time, the switch 10a is set so as not to cut the loop of the PLL circuit.

(2) The initial value of the oscillation frequency band is set at the highest band and the IFVCO 1a is made to oscillate at the target frequency under the control of the PLL circuit.

(3) The tuning voltage of the IFVCO 1a is measured, and the measured value is compared to the upper threshold value and the lower threshold value in the comparators 37 and 38, respectively. When the measured value is within the range between the upper and lower thresholds, this band is selected and the automatic calibration is finished.

(4) In the above-described step (3), the band is sequentially incremented and the steps (1) to (3) are repeated until the automatic calibration is finished.

For example, in FIG. 28, the band 2 in the bands 4 to 2 is set between the upper threshold value and the lower threshold value. In this case, even if the bands 4 or 3 is set, the comparison result between the measured value obtained by oscillating the IFVCO 1a and the upper threshold value and the comparison result between the measured value and the lower threshold value each show that both of the measured values are without the range between the upper and lower thresholds. Therefore, the process proceeds to the setting of the next band. Then, when the band 2 is set, the comparison result between the measured value and the upper threshold value and the comparison result between the measured value and lower threshold value each show that the measured value is within the range between the upper and lower threshold values. Therefore, the band 2 is selected and the automatic calibration is finished.

Note that, in FIG. 28, the case where the initial value of the oscillation frequency band is set at the highest band has been described, but, for example, it is also possible to set the initial value at the lowest band.

3. Securement of Performance Margin

The sensitivity of the VCO oscillation frequency vs the VCO tuning voltage depends on the oscillation frequency band. Therefore, since the loop bandwidth of the PLL circuit changes depending on the selected band, the design of the LPF of the PLL circuit becomes difficult. Thereupon, in the present invention, ensurement of the performance margin is desired by performing the following method: 3-1. A method of switching the current value of the charge pump depending on the band.

3-1. A Method of Switching a Current Value of a Charge Pump Depending on a Band

With reference to FIGS. 29 and 30, the method of switching a current value of a charge pump depending on a band will be described. FIG. 29 is an explanatory diagram of the band dependence of the sensitivity of the VCO oscillation frequency vs the VCO tuning voltage. FIG. 30 is a block diagram of the PLL circuit that uses a VCO having multiple oscillation bands and includes a control function for switching a current of the charge pump.

The sensitivity of the VCO oscillation frequency vs the VCO tuning voltage depends on the oscillation frequency band. More specifically, the VCO tuning sensitivity can be expressed by the expression (7) in the relation between the oscillation frequency fn and the tuning voltage V.

$$VCO \text{ tuning sensitivity} = \Delta fn/\Delta V \qquad (7)$$

For example, as shown in FIG. 29, the VCO tuning sensitivity of the RFVCO 1 increases as the band becomes higher. Assuming that the tuning sensitivity of the band 0 is $\Delta f0/\Delta V$ and the tuning sensitivity of the band 15 is $\Delta f15/\Delta V$, the relation of $(\Delta f15/\Delta V) > (\Delta f0/\Delta V)$ can be obtained. Therefore, since the loop bandwidth of the PLL circuit is changed depending on the selected band, the designs of the LPF 7 and the like of the PLL circuit become difficult. More specifically, this is because the PLL bandwidth is determined depending on the tuning sensitivity of the RFVCO 1, and the variable division ratio of the RFVCO 1, and the current value of the charge pump 6, and the frequency characteristic of the LPF 7.

Meanwhile, if the variance of the tuning sensitivity of the RFVCO 1 depending on the band can be cancelled by other elements, it is possible to keep the PLL bandwidth constant. In the present invention, by measuring the tuning sensitivity of each band in advance with simulation or the like and obtaining the tuning sensitivity information of each band as a table and switching the current value of the charge pump 6 at the time of the band selection so as to correspond to each band, the PLL bandwidth of the PLL circuit can be kept constant.

For example, in the PLL circuit that uses the RFVCO 1 having multiple oscillation bands and is shown in FIG. 30, to the same circuit configuration as circuit configuration shown in FIG. 2 described above, a control function for switching the current value of the charge pump 6 depending on the band is added. More specifically, in this configuration, the tuning sensitivity information of each band is memorized as a tuning sensitivity information table 17 in the memory circuit 12, and the current value of the charge pump 6 can be switched depending on the band and based on the tuning sensitivity information memorized in the tuning sensitivity information table 17 at the time of the band selection by the band control circuit 14. For example, the tuning sensitivity information is changed by increasing the current when the sensitivity of each band is small and by decreasing the current when the sensitivity of each band is large, and thereby the PLL bandwidth can be kept constant.

The PLL circuit having such a characteristic as described above can be applied to, for example, the RFIC that is shown in FIG. 31 and constitutes a multi-band mobile phone. FIG. 31 shows a detailed configuration example of the RFIC and a schematic configuration of the whole of a mobile phone. Although being not particularly limited, the mobile phone is called the so-called direct conversion system.

In the RFIC of this mobile phone, although being not particularly limited, for example, the following processes are used: 1-1. a process of applying, to an RF synthesizer, a DC voltage source having a temperature characteristic which employs a method of minimizing an influence that the fluctuation of the VCO oscillation frequency due to temperature change exerts on the time of the automatic band selection; 1-2. a process of applying, to an RF synthesizer, a recalibration having employed the method (1) of performing the recalibration; 2-1. a process of applying, to an RF synthesizer, a method of calculating the error of the target frequency; and 3-1. a process of applying, to an RF synthesizer, a method of switching the current value of the charge pump depending on the band.

Note that, needless to say, the method (2) of performing the recalibration may be employed instead of the method (1) of performing the recalibration in item 1-2. described above, and item 2-2. a method of comparing a target frequency in level, item 2-3. a method of measuring a VCO tuning voltage, or item 2-4. a method of measuring another VCO tuning voltage may be applied instead of item 2-1. a method of calculating the error of a target frequency.

In FIG. 31, the mobile phone is constituted by: an antenna 51 for transmitting/receiving a signal wave; an antennal switch 52 for switching the transmit mode and receive mode; a power amplifier module 53 for amplifying a transmitted signal; a TXVCO (an oscillator for transmitting) 54; a loop filter 55 constituting a PLL circuit in a transmission side; the above-mentioned RFVCO 1 for generating an oscillation signal having a frequency corresponding to a desired band; an SAW (high-frequency filter) 56 for removing unnecessary wave from a received signal of three types; an RFIC 57; the above-mentioned baseband LSI 8 for converting the transmitted information into I signal or Q signal and controlling the RFIC 57; and the like.

The RFIC 57 is constituted by: an RF synthesizer 58 constituting the PLL circuit along with the RFVCO 1 that is composed of the circuit components shown in FIG. 2 (FIG. 30) and generates an oscillation signal having a high frequency band; an IF synthesizer 59 constituting the PLL circuit along with the IFVCO 1a that is composed of the circuit components shown in FIG. 11 and generates an oscillation signal having an intermediate frequency band; a transmitter type circuit; a receiver type circuit; and the like.

As an example, the transmitter type circuit is provided with: a divider circuit 60 for generating a carrier wave by dividing an oscillation signal generated in the IFVCO 1a; a modulation circuit 61 for directly modulating the carrier wave outputted from this divider circuit 60 by the use of the I signal and Q signal supplied from the baseband LSI 8; a divider circuit 62 for dividing the oscillation signal supplied from the RFVCO 1; a switch 63 for switching to the GSM or the DCS/PCS; a mixer 64 for synthesizing the signal divided by the divider circuit 62 and the transmitted signal fed back from the TXVCO 54 to generate a signal having a frequency corresponding to the difference between the frequencies of the two signals; a PSD (phase detection circuit) 66 for detecting the phase difference between the signal from the mixer 64 and the modulation signal from the modulation circuit 61 via a filter 65; and the like.

Although not particularly limited, in this embodiment, the RF synthesizer 58 constituting the PLL circuit along with the RFVCO 1 is commonly used in the transmitter type circuit and the receiver type circuit. Also, as an example, the receiver type circuit is provided with: an LNA (low noise amplifier) 67 for amplifying the received signals of the three types of 925 MHz to 960 MHz, 1805 MHz to 1880 MHz, and 1930 MHz to 1990 MHz; a demodulation circuit 68 for making a demodulation by synthesizing, in the mixer, the received signal and the signal into which the oscillation signal of the RFVCO 1 is divided by the divider circuit 62; a receiving baseband processor circuit 69 for amplifying the demodulated signal and outputting the amplified signal to the baseband LSI 8; and the like.

In this embodiment, the phase detection circuit 66, the loop filter 55, the TXVCO 54, and the mixer 64 constitute the transmission PLL circuit that performs the frequency conversion. In a multi-band mobile phone, the oscillation frequency of the RFVCO 1 is switched by, for example, by the commands from the baseband LSI 8 depending on the band to be used, and thereby the transmission frequency is switched.

For example, in the triple band RFIC 57 of this embodiment, the IFVCO 1a is set at a frequency of 320 MHz, the TXVCO 54 is set at frequencies of 880 to 915 MHz and 1710 to 1910 MHz, and the RFVCO 1 is set at a frequency of 3580 to 3980 MHz. The oscillation frequency of the IFVCO 1a is set at 320 MHz in any cases of the GSM, DCS and PCS, and is divided into one-fourth in the divider circuit 60, and the carrier wave of 80 MHz is generated, and thus the modulation is performed.

Meanwhile, the oscillation frequency of the RFVCO 1 is set at 3840 to 3980 MHz in the case of the GSM, at 3580 to 3730 MHz in the case of the DCS, and at 3860 to 3980 MHz in the case of the PCS, respectively. This frequency is divided into one-fourth in the divider circuit 62 in the case of the GSM or divided into half in the cases of the DCS and the PCS, and then is supplied to the mixer 64. In the mixer 64, a signal is outputted which corresponds to the difference between this frequency and the frequency of the oscillation signal for transmission sent from the TXVCO 54, and the transmission PLL circuit is operated so as to correspond to the frequencies of the difference signal and the modulation signal. In the above-mentioned embodiment, it has been described that a frequency band, at the time when the VCO tuning voltage has first a value equal to or less than the threshold corresponding to the target frequency, is selected. However, a frequency band, at the time when the VCO tuning voltage has first a value less than the threshold corresponding to the target frequency, may be selected. Note that, in the present application, "a value equal to or less than the threshold" also includes "a value less than the threshold".

Hence, according to the PLL circuit described in this embodiment and the mobile phone having applied this PLL circuit to the RFIC, the advantages as follows can be obtained.

(1) By implementing 1-1. a method of minimizing an influence which the fluctuation of the VCO oscillation frequency due to temperature change exerts on the time of the automatic band selection, and 1-2. a method of performing a recalibration, it is possible to select the optimum band in the PLL circuit including the RFVCO 1 having multiple oscillation frequency bands even in the case where the oscillation frequency of each band is changed depending on temperature change.

(2) By implementing 2-1. a method of calculating an error of a target frequency, 2-2. a method of comparing the target frequency in level, 2-3. a method of measuring a VCO tuning voltage, and 2-4. a method of measuring another VCO tuning voltage, in the PLL circuit in which the IFVCO 1a having multiple oscillation frequency bands are included but the switching of the band that has once been determined is not required, it is possible to reduce the occupied area thereof.

(3) By implementing 3-1. a method of switching the current value of the charge pump depending on the band, in the case where the sensitivity of the oscillation frequency vs the tuning voltage of the RFVCO 1 differs depending on the band, it is possible to keep the bandwidth of the PLL circuit constant by switching the current of the charge pump 6.

In the foregoing, the inventions made by the inventors thereof have been described based on the embodiments in detail. However, it goes without saying that the present invention is not limited to the above-mentioned embodiments and can be variously modified and changed without departing from the gist thereof.

For example, in the foregoing embodiments, an example where the present invention is applied to a mobile phone has been described. However, the application of the present invention is not limited to this and the present invention can be effectively applied to any mobile communication devices. Further, the present invention can be applied to the wireless communication system or the like in which the PLL circuit using the VCO having multiple oscillation frequency bands is indispensable.

What is claimed is:

1. A communication apparatus comprising a circuit device having an oscillating means for oscillating in a plurality of frequency bands, a signal generating means which includes said oscillating means for generating an oscillation signal according to desired frequency information, wherein said circuit device comprising:

a power source means for generating a DC voltage as a control voltage of said oscillating means, when the frequency of said oscillating means increases in accordance with increasing of said control voltage of said oscillating means, said DC voltage having reverse dependence to dependence of said oscillating means in frequency relative to temperature in the case, when the frequency of said oscillating means decreases in accordance with increasing of said control voltage of said oscillating means, said DC voltage having the same dependence as dependence of said oscillating means in frequency relative to temperature in the case, a counter means for measuring an oscillation frequency of said oscillating means;

a storage means for storing frequency information measured per each frequency band of said oscillating means by said counter means; and a control means for performing calibration by connecting said oscillating means to said power source means, oscillating said oscillating means in accordance with one of said DC voltage supplied from said power source means, measuring this oscillation frequency per each frequency band of said oscillating means by said counter means, and storing the oscillation frequency in said storage means.

2. A communication apparatus comprising a circuit device having an oscillating means for oscillating in a plurality of frequency bands, a signal generating means which includes said oscillating means for generating an oscillation signal according to desired frequency information, wherein said circuit device comprising:

a power source means for generating a DC voltage as a control voltage of said oscillating means, when the frequency of said oscillating means increases in accordance with increasing of said control voltage of said oscillating means, said DC voltage having reverse dependence to dependence of said oscillating means in frequency relative to temperature in the case, when the frequency of said oscillating means decreases in accordance with increasing of said control voltage of said oscillating means, said DC voltage having the same dependence as dependence of said oscillating means in frequency relative to temperature in the case;

a counter means for measuring an oscillation frequency of said oscillating means;

a storage means for storing frequency information measured per each frequency band of said oscillating means by said counter means; and a control means for performing recalibration after said oscillating means is connected to said power source means, oscillating said oscillating means in accordance with one of said DC voltage supplied from said power source means, measuring an error of a first frequency band out of all frequency bands of said oscillating means by said counter means when this oscillation frequency is measured, estimating, from the error, errors of the other frequency bands, and storing the errors in said storage means.

* * * * *